(12) United States Patent
Mori et al.

(10) Patent No.: US 9,593,423 B2
(45) Date of Patent: *Mar. 14, 2017

(54) PROCESS FOR FORMING METAL FILM, AND PRODUCT EQUIPPED WITH METAL FILM

(71) Applicants: Kunio Mori, Morioka-shi (JP); Sulfur Chemical Laboratory Incorporated, Morioka-shi (JP); Meiko Electronics Co., Ltd., Ayase-shi (JP)

(72) Inventors: Kunio Mori, Morioka (JP); Yusuke Matsuno, Morioka (JP); Katsuhito Mori, Morioka (JP); Takahiro Kudo, Morioka (JP); Shigeru Michiwaki, Yokohama (JP); Manabu Miyawaki, Fujisawa (JP)

(73) Assignees: Kunio Mori, Morioka-shi (JP); Sulfur Chemical Laboratory Incorporated, Morioka-shi (JP); Meiko Electronics Co., Ltd., Ayase-shi (JP)

( * ) Notice: Subject to any disclaimer, the term of this patent is extended or adjusted under 35 U.S.C. 154(b) by 362 days.

This patent is subject to a terminal disclaimer.

(21) Appl. No.: 14/218,670

(22) Filed: Mar. 18, 2014

(65) Prior Publication Data

US 2014/0227539 A1 Aug. 14, 2014

Related U.S. Application Data

(63) Continuation of application No. 13/823,526, filed as application No. PCT/JP2011/072559 on Sep. 30, 2011, now Pat. No. 8,753,748.

(30) Foreign Application Priority Data

Oct. 4, 2010 (JP) .................................. 2010-225165

(51) Int. Cl.
  C23C 18/20 (2006.01)
  C23C 18/16 (2006.01)
  (Continued)

(52) U.S. Cl.
  CPC ...... *C23C 18/1608* (2013.01); *C23C 18/1612* (2013.01); *C23C 18/1653* (2013.01);
  (Continued)

(58) Field of Classification Search
  USPC ... 427/98.5, 553, 558, 515, 516; 205/50, 91, 205/164; 524/837, 863
  See application file for complete search history.

(56) References Cited

U.S. PATENT DOCUMENTS

| | | | | |
|---|---|---|---|---|
| 6,011,135 A | * | 1/2000 | Mori | .................... C07D 251/46 528/373 |
| 7,674,870 B2 | * | 3/2010 | Tsuchida | ................ C08G 77/26 528/27 |

(Continued)

FOREIGN PATENT DOCUMENTS

| | | |
|---|---|---|
| CN | 1382195 A | 11/2002 |
| JP | 2006 213677 | 8/2006 |

(Continued)

OTHER PUBLICATIONS

Mori, K., "The 21th Century Adhesion Technology—Molecular Adhesives—," Journal of the Adhesion Society of Japan, vol. 43 (6), pp. 242 to 248, (2007) (with partial English translation).

(Continued)

*Primary Examiner* — Dah-Wei D Yuan
*Assistant Examiner* — Jose Hernandez-Diaz
(74) *Attorney, Agent, or Firm* — Oblon, McClelland, Maier & Neustadt, L.L.P.

(57) ABSTRACT

The purpose of the present invention is to provide a wiring substrate from which a metal film cannot be detached easily.

(Continued)

A process for forming a metal film comprises a step (X) of applying an agent containing a compound (α) onto the surface of a base and a step (Y) of forming a metal film on the surface of the compound (α) by a wet-mode plating technique, wherein the compound (α) is a compound having either an OH group or an OH-generating group, an azide group and a triazine ring per molecule, and the base comprises a polymer.

12 Claims, 1 Drawing Sheet

(51) Int. Cl.
| | |
|---|---|
| C25D 11/00 | (2006.01) |
| C25D 5/56 | (2006.01) |
| C23C 18/28 | (2006.01) |
| C23C 18/30 | (2006.01) |
| H05K 3/38 | (2006.01) |

(52) U.S. Cl.
CPC ............ *C23C 18/20* (2013.01); *C23C 18/204* (2013.01); *C23C 18/2086* (2013.01); *C23C 18/285* (2013.01); *C23C 18/30* (2013.01); *C25D 5/56* (2013.01); *C25D 11/00* (2013.01); *H05K 3/389* (2013.01); *H05K 2203/072* (2013.01); *H05K 2203/122* (2013.01); *H05K 2203/124* (2013.01); *Y10T 428/31663* (2015.04); *Y10T 428/31678* (2015.04)

(56) References Cited

U.S. PATENT DOCUMENTS

| 2010/0080893 A1* | 4/2010 | Inoue ..................... C23C 18/14 427/123 |
|---|---|---|
| 2011/0104505 A1 | 5/2011 | Mori et al. |

FOREIGN PATENT DOCUMENTS

| JP | 2007 17921 | 1/2007 |
|---|---|---|
| JP | 2007 119752 | 5/2007 |
| JP | 2007 150221 | 6/2007 |
| JP | 2009 137153 | 6/2009 |
| JP | 2009 302081 | 12/2009 |
| WO | WO 2009/154083 A1 | 12/2009 |

OTHER PUBLICATIONS

Mori, K. et al., " Sixivalent Chromate-Free Resin Plating—A Molecular Adhesion Method—," Journal of the Surface Finishing Society of Japan, vol. 59, No. 5, pp. 299 to 304, (2008) (with partial English translation).

Takagi, K. et al., "Direct Adhesion of Silicone Rubber to Resins During Peroxide Curing Using Molecular Adhesive," The Society of Rubber Industry, Japan, vol. 81, pp. 8 to 13, (2008) (with English abstract).

Mori, K. et al., "Direct Adhesion of Epichlorohydrin Rubber to Polyamide 6 During Curing Using a Molecular Adhesive,", The Society of Rubber Industry, Japan, vol. 83 (3), pp. 71 to 76, (2010) (with English abstract).

Matsuno, Y. et al., "Direct Adhesion of EPDM to Aluminum Plate During Peroxide Curing Using Molecular Adhesives," The Society of Rubber Industry, Japan, vol. 83 (4), pp. 89 to 94, (2010) (with English abstract).

Mori, K. et al., " Molecular Adhesion Technology," The Surface Finishing Society of Japan, Plating Section, June Regular Meeting of Plating Section, (Jun. 5-6, 2008) (with partial English translation).

International Search Report Issued Nov. 22, 2011 in PCT/JP11/72559 Filed Sep. 30, 2011.

Combined Chinese Office Action and Search Report issued Oct. 11, 2013 in Patent Application No. 201180041291.3 (with English language translation).

"STN Columbus" STN Search Report, Sep. 26, 2013, 10 Pages.

Takahiro Kakuda "Photosensitive Resin" Science Publishing Company, Feb. 1978, 4 Pages (with partial English language translation).

Roger et al. "Surface characterization of poly (ethylene terephthalate) film modified by a carbohydrate-bearing photo reactive azide group". European Polymer Journal 46, published online on Apr. 9, 2010, pp. 1594-1603.

* cited by examiner

PROCESS FOR FORMING METAL FILM, AND PRODUCT EQUIPPED WITH METAL FILM

TECHNICAL FIELD

The present invention relates to a process for forming a metal film, and products equipped with the metal film.

BACKGROUND ART

Plating products (for example, decorative plating products for automobiles such as emblem) of which a substrate is comprised of ABS resin (high polymer materials) have been proposed. The important property in the plating products of this type is adhesiveness of the metal film (plating film) formed on the substrate by a plating technique. When the adhesive strength is weak, the metal film is easily peeled off. It signifies an increase in reliability of the products that the adhesiveness of the metal film is large.

So as to improve the aforementioned adhesiveness, it has been proposed to form fine irregularities on the substrate surface. That is, it has been proposed to make the surface of the substrate rough. With this, what is called an anchor effect is expected, and the adhesion is improved.

The etching technique using oxidizing agents (for example, aqueous solutions of permanganate, hexavalent chromic acid, and the like) is well known as a technique of making the surface of the substrate rough. However, it is only in the case of resin having an unsaturated group like an ABS copolymer that the etching technology using the hexavalent chromic acid can be employed. For this reason, a constraint is putted on the substrate materials. In addition, in recent years, the use of the hexavalent chromic acid has been strongly regulated. This promotes a search for materials that replace the hexavalent chromic acid. However, in the current situation, no effective measure exists yet.

High integration and densification are required for the circuit substrates as the technology progresses. From this viewpoint, it is preferred that the fewer the irregularities existing on the copper foil surface of the substrate, the better. However, there are the irregularities on the metal film (for example, copper film) formed on the etched substrate surface. When the metal film (copper film) has the irregularities, a propagation distance of signals that flow on the metal film is made long. A propagation loss (attenuation of signals) is also made large. In addition, heat generation occurs. Thus, it is preferred that an irregularity degree of the metal film (copper film) is few. That is, the substrate having a small surface roughness is desired.

A semi-additive technique has started to be employed for establishing wiring circuits in the circuit substrates to cope with a resource problem of copper and a progress in refinement of wiring patterns. The substrate having a small surface roughness is desired from such a viewpoint as well.

A corona discharge treatment (or plasma discharge treatment) is known as a technique of enhancing the adhesiveness between the substrate and the metal film. With the treatment of this type, the OH groups are introduced into the substrate surface. It is said that existence of this OH group contributes to enhancing the adhesiveness of the plating film formed thereon.

However, there exists an anxiety that the corona discharge treatment (or plasma discharge treatment) might deteriorate the substrate. And yet, even though the OH groups are generated, the number thereof is not much. From this, there was a restriction to improvement of the adhesiveness. In addition, the corona discharge treatment (or plasma discharge treatment) puts a constraint to shape or size of to-be-treated substances. Moreover, workability of the discharge treatment is also not good.

CITATION LIST

Patent Literature

PTL 1: JP-P2006-213677A
PTL 2: JP-P2007-17921A
PTL 3: JP-P2007-119752A

Non-Patent Literature

NON-PTL 1: MORI Kunio "The 21th Century Adhesion Technology", Journal of the Adhesion Society of Japan, vol. 43(6), 242-248 (2007)

NON-PTL 2: MORI Kunio and ABE Shiro "Sixvalent Chromate-Free Resin Plating", Journal of the Surface Finishing Society of Japan, vol. 59(5), 299-304 (2008)

SUMMARY OF INVENTION

Technical Problem

This inventor thought that the adhesive phenomenon of the metal film was one of sticking phenomena in the case in which the metal film was formed on the substrate made of a polymer by use of the wet-type plating means. This inventor thought that forming an agent (for example, the agent to be referred to as a molecular adhesive agent advocated by this inventor) bonded to both of the substrate made of a polymer and the metal film on the aforementioned substrate contributed to enhancement in the adhesiveness of the metal film.

As it is, even though the compound referred to as the molecular adhesive agent was employed, the adhesive strength of the metal plating film formed on the substrate made of a polymer was not satisfied. The reason is that the molecular adhesive agent used so far presumes that the substrate surface is subjected to the corona discharge treatment (or plasma discharge treatment).

Thus, the present invention has been accomplished in consideration of the above-mentioned problems, and a task thereof is to provide the technology enabling the high adhesive strength of the formed metal film to be realized even though the corona discharge treatment (plasma discharge treatment) using the etching by acid (for example, the hexavalent chromic acid) is not adopted.

Means for Solving Problem

The aforementioned problem is solved by a method of forming a metal film, which is characterized in including a step (X) of applying an agent containing the following compound (α) onto a base surface, and a step (Y) of forming a metal film on the surface of the aforementioned compound (α) by a wet-type plating technique, wherein the aforementioned compound (α) is a compound having at least one OH group or at least one OH yielding group, at least one azide group, and at least one triazine ring per molecule, and the aforementioned base is configured by employing a polymer.

Preferably, the aforementioned problem is solved by the aforementioned method of forming the metal film, which is characterized in further including a step (W) of irradiating the aforementioned compound (α) existing on the surface of the aforementioned base with light having a predetermined pattern after the aforementioned step (X) and yet before the aforementioned step (Y).

Preferably, the aforementioned problem is solved by the aforementioned method of forming the metal film, which is characterized in that light irradiation of the aforementioned step (W) allows the aforementioned base and the azide group of the aforementioned compound (α) to chemically react to each other, and the aforementioned compound (α) to be bonded to the surface of the aforementioned base.

Preferably, the aforementioned problem is solved by the aforementioned method of forming the metal film, which is characterized in that the aforementioned light is ultraviolet rays.

Preferably, the aforementioned problem is solved by the aforementioned method of forming the metal film, which is characterized in that the aforementioned OH group or OH yielding group is an alkoxysilyl group (the case in which an alkoxy group in the aforementioned alkoxysilyl group is the OH group is also included).

Preferably, the aforementioned problem is solved by the aforementioned method of forming the metal film, which is characterized in that the aforementioned compound (α) is a compound represented by the following general formula [I].

Preferably, the aforementioned problem is solved by the aforementioned method of forming metal films, which is characterized in that the aforementioned compound (α) is a compound represented by the following general formula [Io].

Preferably, the aforementioned problem is solved by the aforementioned method of forming the metal film, which is characterized in that the aforementioned compound (α) is a compound represented by the following general formula [Ia].

Preferably, the aforementioned problem is solved by the aforementioned method of forming metal films, which is characterized in that the aforementioned compound (α) is a compound represented by the following general formula [Ib].

Preferably, the aforementioned problem is solved by the aforementioned method of forming the metal film, which is characterized in further including a step (V) of applying a substance represented by the following general formula [II] onto the surface of the aforementioned compound (α) after the aforementioned step (X) and yet before the aforementioned step (Y).

Preferably, the aforementioned problem is solved by the aforementioned method of forming the metal film, which is characterized in further including a step (U) of applying a compound (β) having an alkoxysilyl group, an alkoxy aluminate group, and/or an alkoxy titanate group onto the surface of the aforementioned compound (α) after the aforementioned step (X) or step (V) and yet before the aforementioned step (Y).

Preferably, the aforementioned problem is solved by the aforementioned method of forming the metal film, which is characterized in that the aforementioned compound (β) is a compound represented by the following general formula [T].

Preferably, the aforementioned problem is solved by the aforementioned method of forming the metal film, which is characterized in that the aforementioned compound (β) is a compound represented by the following general formula [III].

Preferably, the aforementioned problem is solved by the aforementioned method of forming the metal film, which is characterized in that the aforementioned compound (β) is a compound represented by the following general formula [IV].

Preferably, the aforementioned problem is solved by the aforementioned method of forming the metal film, which is characterized in that the aforementioned base is a wiring substrate and one part of the metal film is a plating film including at least Cu.

The aforementioned problem is solved by a product equipped with a metal film, which is characterized in including a base, the following compound (α) applied onto the surface of the aforementioned base, and a wet-type plating metal film formed on the aforementioned compound (α), wherein the aforementioned compound (α) is a compound having at least one OH group or at least one OH yielding group, at least one azide group, and at least one triazine ring per molecule, and the aforementioned base is configured by employing a polymer.

Preferably, the aforementioned problem is solved by the aforementioned product equipped with the metal film, which is characterized in that the aforementioned base and the aforementioned compound (α) are chemically bonded to each other.

Preferably, the aforementioned problem is solved by the aforementioned product equipped with the metal film, which is characterized in that the aforementioned OH group or OH yielding group is an alkoxysilyl group (the case in which an alkoxy group in the aforementioned alkoxysilyl group is the OH group is also included).

Preferably, the aforementioned problem is solved by the aforementioned product equipped with the metal film, which is characterized in that the aforementioned compound (α) is a compound represented by the following general formula [I].

Preferably, the aforementioned problem is solved by the aforementioned product equipped with the metal film, which is characterized in that the aforementioned compound (α) is a compound represented by the following general formula [Io].

Preferably, the aforementioned problem is solved by the aforementioned product equipped with the metal film, which is characterized in that the aforementioned compound (α) is a compound represented by the following general formula [Ia].

Preferably, the aforementioned problem is solved by the aforementioned product equipped with the metal film, which is characterized in that the aforementioned compound (α) is a compound represented by the following general formula [Ib].

Preferably, the aforementioned problem is solved by the aforementioned product equipped with the metal film, which is characterized that a substance represented by the following general formula [II] is applied onto the surface of the aforementioned compound (α).

Preferably, the aforementioned problem is solved by the aforementioned product equipped with the metal film, which is characterized in that a compound (β) having an alkoxysilyl group, an alkoxy aluminate group, and/or an alkoxy titanate group is applied onto the surface of the aforementioned compound (α).

Preferably, the aforementioned problem is solved by the aforementioned product equipped with the metal film, which is characterized in that the aforementioned compound (β) is a compound represented by the following general formula [T].

Preferably, the aforementioned problem is solved by the aforementioned product equipped with the metal film, which is characterized in that the aforementioned compound (β) is a compound represented by the following general formula [III].

Preferably, the aforementioned problem is solved by the aforementioned product equipped with the metal film, which is characterized in that the aforementioned compound (β) is a compound represented by the following general formula [IV].

Preferably, the aforementioned problem is solved by the aforementioned product equipped with the metal film, which is characterized in that the aforementioned product is a wiring substrate.

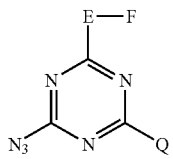

General formula [I]

[In the formula, E is an arbitrary group. F is an OH group or an OH yielding group. -Q is —N$_3$ or —NR$_1$(R$_2$). Each of R$_1$ and R$_2$ of —NR$_1$(R$_2$) is H, a hydrocarbon group having a carbon number of 1 to 24, or —RSi(R')$_n$(OA)$_{3-n}$ (R is a chain hydrocarbon group having a carbon number of 1 to 12. R' is a chain hydrocarbon group having a carbon number of 1 to 4. A is H or a chain hydrocarbon group having a carbon number of 1 to 4. n is an integer of 0 to 2). Each of R$_1$ and R$_2$ could be identical or could be different.]

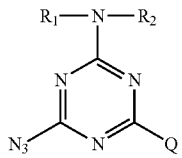

General formula [Io]

[In the formula, -Q is —N$_3$ or —NR$_1$(R$_2$). Each of R$_1$ and R$_2$ is H, a hydrocarbon group having a carbon number of 1 to 24, or —RSi(R')$_n$(OA)$_{3-n}$ (R is a chain hydrocarbon group having a carbon number of 1 to 12. R' is a chain hydrocarbon group having a carbon number of 1 to 4. A is H or a chain hydrocarbon group having a carbon number of 1 to 4. n is an integer of 0 to 2). At least one, out of R$_1$ and R$_2$, is the aforementioned —RSi(R')$_n$(OA)$_{3-n}$. Each of R$_1$ and R$_2$ could be identical or could be different.]

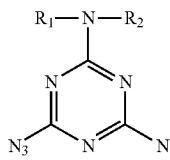

General formula [Ia]

[In the formula, each of R$_1$ and R$_2$ is H, a hydrocarbon group having a carbon number of 1 to 24, or —RSi(R')$_n$(OA)$_{3-n}$ (R is a chain hydrocarbon group having a carbon number of 1 to 12. R' is a chain hydrocarbon group having a carbon number of 1 to 4. A is H or a chain hydrocarbon group having a carbon number of 1 to 4. n is an integer of 0 to 2). At least one, out of R$_1$ and R$_2$, is the aforementioned —RSi(R')$_n$(OA)$_{3-n}$. Each of R$_1$ and R$_2$ could be identical or could be different.]

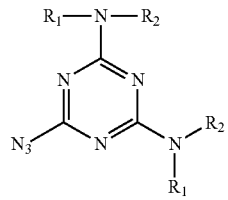

General formula [Ib]

[In the formula, each of R$_1$ and R$_2$ is H, a hydrocarbon group having a carbon number of 1 to 24, or —RSi(R')$_n$(OA)$_{3-n}$ (R is a chain hydrocarbon group having a carbon number of 1 to 12. R' is a chain hydrocarbon group having a carbon number of 1 to 4. A is H or a chain hydrocarbon group having a carbon number of 1 to 4. n is an integer of 0 to 2). At least one, out of all R$_1$s and all R$_2$s, is the aforementioned —RSi(R')$_n$(OA)$_{3-n}$. Each of R$_1$ and R$_2$ could be identical or could be different.]

General formula [II]

$$-\!\!\left(\!O\!-\!\overset{\overset{G}{|}}{\underset{\underset{B}{|}}{X'}}\!\right)_{\!n}\!\!\left(\!O\!-\!\overset{\overset{G}{|}}{\underset{\underset{B}{|}}{Y'}}\!\right)_{\!m}\!\!\left(\!O\!-\!\overset{\overset{G}{|}}{Z}\!\right)_{\!p}\!\!-$$

[In the formula, each of X' and Y' is Si or Ti. Z is Al. G is a hydrocarbon group having a carbon number of 1 to 3 or an alkoxy group having a carbon number of 1 to 3. B is an alkoxy group having a carbon number of 1 to 3. Each of n and m is an integer of 0 to 200 (where 2≤n+m≤400). p is an integer of 0 to 100].

L-Si(M')$_n$(OM)$_{3-n}$    General formula [T]

[In the formula, L is an organic group (The organic group may contain elements other than carbon and hydrogen. The organic group may contain a substituent group. The organic group may assume any form of an aliphatic type, an aromatic type, a chain type and a cyclic type). M' is a chain hydrocarbon group having a carbon number of 1 to 4. M is H or a chain hydrocarbon group having a carbon number of 1 to 4. n is an integer of 0 to 2. Each of the aforementioned M' and M could be identical or could be different.]

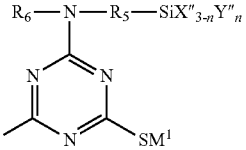

General formula [III]

[In the formula, R$_5$ is a hydrocarbon group having a carbon number of 1 to 12. R$_6$ is H or a hydrocarbon group having a carbon number of 1 to 10. X" is H or a hydrocarbon group having a carbon number of 1 to 10. Y" is an alkyloxy group having a carbon number of 1 to 10. n is an integer of 1 to 3. M$^1$ is H, Li, Na, K, or Cs.]

General formula [IV]

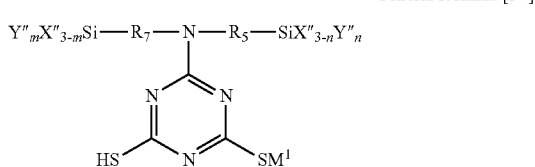

[In the formula, $R_5$ is a hydrocarbon group having a carbon number of 1 to 12. $R_7$ is a hydrocarbon group having a carbon number of 1 to 12. X" is H or a hydrocarbon group having a carbon number of 1 to 10. Y" is an alkyloxy group having a carbon number of 1 to 10. Each of all X"s and all Y"s could be identical to the other or could be different from the other. Each of n and m is an integer of 1 to 3. $M^1$ is H, Li, Na, K, or Cs.]

Advantageous Effect of Invention

The metal film having a high adhesiveness is formed. For example, the products of which the metal plating film is hardly peeled off (for example, the functional products (circuit substrates) and the design (decorative) products) are obtained.

DESCRIPTION OF EMBODIMENTS

Figure 1:
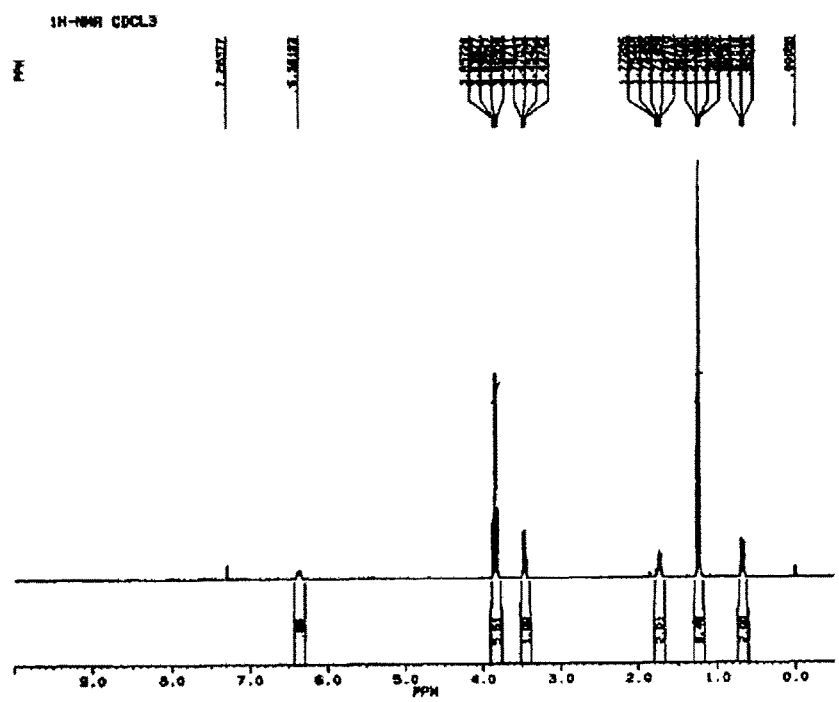
FIG. 1 is a spectrum diagram of $^1$H-NMR of TE-DAZ.
Figure 2:
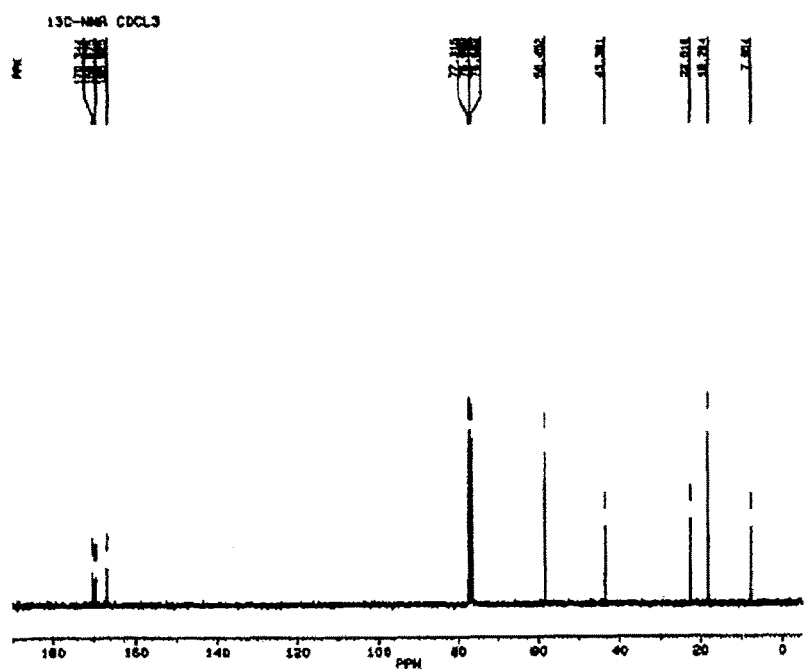
FIG. 2 is a spectrum diagram of $^{13}$C-NMR of TE-DAZ.

A first present invention is a method of forming the metal film. In particular, the first present invention is a method that is employed when the metal film is formed with the wet-type plating technique. For example, it is a manufacturing method of the functional substrate such as the wiring substrate. Or, it is a manufacturing method of the design products (decorative products). This process includes a step (X) and a step (Y). The aforementioned step (X) is a step of applying the agent containing a compound (α) onto the base surface. The aforementioned step (Y) is a step of forming the metal film on the surface of the aforementioned compound (α) by the wet-type plating technique. The aforementioned compound (α) has at least one OH group or at least one OH yielding group, and at least one azide group per molecule. The aforementioned base is configured by employing a polymer.

The aforementioned step (X) is accomplished by immersing the base into a solution containing the aforementioned compound (α) (for example, dissolved or dispersed). The aforementioned step (X) is also accomplished by blowing away the aforementioned solution onto necessary locations of the base (wholly or partially). Thereafter, the drying is performed according to a necessity. That is, the solvent is vaporized, thereby allowing the aforementioned compound (α) to be left on the base surface.

Particularly preferably, the aforementioned method further includes a light irradiating step. That is, light is radiated toward the aforementioned compound (α) existing on the surface of the aforementioned base. As a result, the aforementioned base and the azide group of the aforementioned compound (α) chemically react to each other. And the aforementioned compound (α) is bonded to the surface of the aforementioned base. The chemical reaction is hardly promoted in the location not irradiated with light. Thus, thereafter, when the washing is performed, a phenomenon that the aforementioned compound (α) exists on (has been bonded to) the surface of the aforementioned base occurs only on the locations irradiated with light. It is enough to arrange masks in specific locations at the time of the light irradiation (light exposure) so as not to irradiate the specific locations with light. A reflective plate and a reflective film can be employed at the time of the light irradiation. This enhances irradiation efficiency. An irradiation scope spreads. The aforementioned light is preferably ultraviolet rays.

The OH group or OH yielding group of the aforementioned compound (α) is preferably an alkoxysilyl group (the case in which the aforementioned alkoxy group is the OH group is also included). In this case, the aforementioned compound (α) has at least one alkoxysilyl group and at least one azide group. Preferably, the aforementioned compound (α) further has the triazine ring.

The aforementioned compound (α) has a structure in which at least one azide group and at least one alkoxysilyl group are preferably bonded to triazine directly or indirectly (among them, 1,3,5-triazine).

The aforementioned compound (α) is preferably a compound represented by the aforementioned general formula [I]. More preferably, the aforementioned compound (α) is a compound represented by the aforementioned general formula [Io]. Yet more preferably, the aforementioned compound (α) is a compound represented by the aforementioned general formulas [Ia] or [Ib].

In the aforementioned general formula, -Q is —$N_3$ or —$NR_1(R_2)$. Each of $R_1$ and $R_2$ is H, a hydrocarbon group having a carbon number of 1 to 24, or —RSi(R')$_n$(OA)$_{3-n}$ (R is a chain hydrocarbon group having a carbon number of 1 to 12. R' is a chain hydrocarbon group having a carbon number of 1 to 4. A is H or a chain hydrocarbon group having a carbon number of 1 to 4. n is an integer of 0 to 2.) Each of $R_1$ and $R_2$ could be identical or could be different.

In the aforementioned general formula [Ia], each of $R_1$ and $R_2$ is H, a hydrocarbon group having a carbon number of 1 to 24, or —RSi(R')$_n$(OA)$_{3-n}$. The aforementioned hydrocarbon group having a carbon number of 1 to 24 is a chain hydrocarbon group, a chain hydrocarbon group having a substituent group (cyclic or chain), a cyclic group, or a cyclic group having a substituent group (cyclic or chain). For example, each of $R_1$ and $R_2$ is —$C_nH_{2n+1}$, —$C_nH_{2n-1}$, —$C_6H_5$, —$CH_2CH_2C_6H_5$, —$CH_2C_6H_5$, —$C_{10}H_7$, or the like. R of the aforementioned —RSi(R')$_n$(OA)$_{3-n}$ is a chain hydrocarbon group having a carbon number of 1 to 12 (for example, —$C_nH_{2n}$). The aforementioned R' is a chain hydrocarbon group having a carbon number of 1 to 4 (for example, —$C_nH_{2n+1}$). The aforementioned A is H or a chain hydrocarbon group having a carbon number of 1 to 4 (for example, —$CH_3$, —$C_2H_5$, —$CH(CH_3)_2$, —$CH_2CH(CH_3)_2$, and —$C(CH_3)_3$). n is an integer of 0 to 2. At least one, out of $R_1$ and $R_2$, is the aforementioned —RSi(R')$_n$(OA)$_{3-n}$. Each of $R_1$ and $R_2$ could be identical or could be different. The so-called group having a substituent group (for example, hydrocarbon group) in this specification signifies a group in which for example, H of the aforementioned group (for example, hydrocarbon group) has been replaced with a substitutable appropriate functional group.

In the aforementioned general formula [Ib], each of $R_1$ and $R_2$ is H, a hydrocarbon group having a carbon number of 1 to 24, or —RSi(R')$_n$(OA)$_{3-n}$. The aforementioned hydrocarbon group having a carbon number of 1 to 24 is a chain hydrocarbon group, a chain hydrocarbon group having a substituent group (cyclic or chain), a cyclic group, or a cyclic group having a substituent group (cyclic or chain). For example, each of $R_1$ and $R_2$ is $-C_nH_{2n+1}$, $-C_nH_{2n-1}$, $-C_6H_5$, $-CH_2CH_2C_6H_5$, $-CH_2C_6H_5$, $-C_{10}H_7$, or the like. R of the aforementioned $-RSi(R')_n(OA)_{3-n}$ is a chain hydrocarbon group having a carbon number of 1 to 12 (for example, $-C_nH_{2n}$). The aforementioned R' is a chain hydrocarbon group having a carbon number of 1 to 4 (for example, $-C_nH_{2n+1}$). The aforementioned A is H or a chain hydrocarbon group having a carbon number of 1 to 4 (for example, $-CH_3$, $-C_2H_5$, $-CH(CH_3)_2$, $-CH_2CH(CH_3)_2$, and $-C(CH_3)_3$). n is an integer of 0 to 2. At least one, out of all $R_1$s and all $R_2$s, is the aforementioned $-RSi(R')_n(OA)_{3-n}$. Each of $R_1$ and $R_2$ could be identical or could be different.

Preferably, the aforementioned method further includes a step (V) of applying a substance represented by the aforementioned general formula [II] onto the surface of the aforementioned compound (α) after the aforementioned step (X) and yet before the aforementioned step (Y). That is, existence of the polymer represented by the aforementioned general formula [II] on the surface caused the number of $-OH$ groups existing on the surface to be increased, and the adhesiveness (peeling resistance) of the metal film to be improved.

In the aforementioned general formula [II], each of X' and Y' is Si or Ti. Z is Al. G is a hydrocarbon group having a carbon number of 1 to 3 (for example, $-CH_3$, $-C_2H_5$, and $-CH=CH_2$), or an alkoxy group having a carbon number of 1 to 3 (for example, $-OCH_3$ and $-OC_2H_5$). B is an alkoxy group having a carbon number of 1 to 3 (for example, $-OCH_3$ and $-OC_2H_5$). Each of n and m is an integer of 0 to 200 (where 2≤n+m≤400). p is an integer of 0 to 100. Preferably, n≠1, m≠1, and p≠1.

Preferably, the aforementioned method further includes a step (U) of applying a compound (β) having an alkoxysilyl group, an alkoxy aluminate group, and/or an alkoxy titanate group onto the surface of the aforementioned compound (α) after the aforementioned step (X) (or step (V)) and yet before the aforementioned step (Y). That is, existence of the aforementioned compound (β) on the surface causes the number of $-OH$ groups existing on the surface to be increased. Or, in addition, reactive functional groups are introduced. And, the adhesiveness (peeling resistance) of the metal film was improved. Herein, the aforementioned compound (β) is preferably a compound represented by the aforementioned general formulas [T], [III], or [IV].

In the aforementioned general formulas [III] and [IV], each of $R_5$ and $R_7$ is a hydrocarbon group having a carbon number of 1 to 12. $R_6$ is H or a hydrocarbon group having a carbon number of 1 to 10. The aforementioned hydrocarbon group is a chain hydrocarbon group or a cyclic hydrocarbon group. More specifically, the above hydrocarbon group is a saturated aliphatic hydrocarbon group. Or, the above hydrocarbon group is an unsaturated aliphatic hydrocarbon group. Or, the above hydrocarbon group is an aromatic hydrocarbon group. The aforementioned aliphatic hydrocarbon group could be a linear chain hydrocarbon group or a branched chain hydrocarbon group. There are the case in which the aforementioned aromatic hydrocarbon group has a substituent group and the case in which the aforementioned aromatic hydrocarbon group has no substituent group. In addition, there are the case in which each of the aforementioned $R_5$ and $R_7$ has groups such as $-NH-$, $-CO-$, $-O-$, $-S-$, and $-COO-$ and the case in which it has not. X" is H or a hydrocarbon group having a carbon number of 1 to 10. This hydrocarbon group is a chain hydrocarbon group. More specifically, this hydrocarbon group is a saturated aliphatic hydrocarbon group. Or, this hydrocarbon group is an unsaturated aliphatic hydrocarbon group. These aliphatic hydrocarbon groups have no cyclic group; however, they have a cyclic group as a substitute group in some cases. Y" is an alkyloxy group having a carbon number of 1 to 10. n is an integer of 1 to 3. $M^1$ is H, Li, Na, K, or Cs.

There exist the technique using the dry-type plating (evaporation and spattering) and the technique using the wet-type plating as a technique of forming the metal film. The technique using the wet-type plating is employed in the aforementioned step (Y). The aforementioned wet-type plating is, for example, electroless plating. Or, the aforementioned wet-type plating is electroplating. Only one of them may be adopted. Both may be adopted. Additionally, as this technology, the publicly known technologies may be adopted.

A second present invention is a product equipped with the metal film. For example, the second present invention is the functional plating products (transportation apparatuses (for example, automobiles), or wiring substrates (print wiring substrates and circuit substrates) in electric/electronic apparatuses. The second invention is design products (decorative products). This product includes a base, a compound (α) applied onto the surface of the aforementioned base, and a wet-type plating metal film formed on the aforementioned compound (α). The aforementioned compound (α) has at least one OH group or at least one OH yielding group, and at least one azide group per molecule. The compound (α) is the previously described compound. The compound represented by the aforementioned general formulas [II], [T], [III], or [IV] is employed together with the aforementioned compound (α), according to a necessity. The aforementioned base is configured by employing a polymer.

The present invention makes it possible to cause the compound (α) represented by, for example, the aforementioned general formulas [I] [Io], [Ia], or [Ib] and an amplifying agent (for example, the compound represented by the general formulas [II], [T], [III], or [IV]) to coexist on the surface of the base. And, thereafter, light (ultraviolet rays) is radiated. Or, light is radiated after heating. In the present invention, the compound (α) represented by the aforementioned general formulas [I], [Io], [Ia], or [Ib] is applied onto the surface of the base. Or, in addition, the amplifying agent (for example, the compound represented by the general formulas [II], [T], [III], or [IV]) is applied. And, light is radiated. Or, light is radiated after heating. Thereafter, it is preferably immersed into an acid solution or an alkaline solution.

In the present invention, a silane coupling agent having an alkoxysilyl group and a photosensitizer based on benzo phenone and the like may be also used together with, or instead of the aforementioned amplifying agent.

In accordance with the present invention, the chemical reaction (bonding) between the azide group of the compound (α) and the base allows, for example, the alkoxysilyl group to be introduced into the base surface. And, the alkoxysilyl group is modified into the OH group. As a result, the adhesiveness (peeling resistance) of the metal film (plating film) formed by the wet-type plating was improved. Conventionally, it was performed to make the surface roughness of the base rough so as to improve the adhesiveness (peeling resistance) of the metal film (plating film). That is, the treatment by strong acid such as hexavalent chromic acid and sulfuric acid was performed for the base; however the use of such a treatment was eliminated. In addition, when the corona discharge treatment and the plasma discharge treatment that have been conventionally performed prior to performing the treatment of the molecular adhesive agent is performed, there is an anxiety over deterioration in the base made of resin. However, these treatments have become unessential.

The aforementioned compound (α) is applied onto the base surface. Thereafter, light is radiated. At this time, the chemical reaction occurs between the aforementioned compound (α) and the base. As a result, the aforementioned compound (α) and the base are bonded to each other. The base is configured of a polymer. As the aforementioned polymer, curing resin (for example, thermosetting resin, photo-curing resin and electron-beam curing resin) and thermoplastic resin can be listed. Fiber-reinforced resin as well can be listed. Rubber (vulcanized rubber) can be also listed. In addition to these, the material having a coating film containing a polymer formed on the surface thereof may be used.

It is known that the azide compound is a crosslinking agent. Irradiation of a composite containing the azide compound with the ultraviolent rays allows the polymer having a crosslinking structure to be obtained. However, it was not known whether or not the azide group was chemically bonded to the polymer (molecular chains of the polymer surface) when the ultraviolet rays were radiated in a situation in which the azide compound existed on the polymer surface.

The following experiment was tried by this inventor. The aforementioned compound (α) (in particular, the compounds represented by the aforementioned general formulas [I], [Io], [Ia], and [Ib]) was applied onto the polymer surface. Thereafter, light was radiated. As a result, the chemical reaction occurred between the azide group and the polymer (molecular chains of the polymer surface). That is, the chemical bonding occurred between the aforementioned compound (α) and the aforementioned polymer. And, it became clear that the alkoxysilyl group was present on the polymer surface. This fact was not able to be imaged from the conventional knowledge. And, the base subjected to a surface modification with the alkoxysilyl group was treated with the compounds represented by the aforementioned general formulas [II], [III], and [IV]) and silane coupling agents. With this, the adhesiveness of the metal film was improved all the more.

Hereinafter, the present invention will be explained from a viewpoint different from the above-mentioned viewpoint.

[Compound (α) (Adhesiveness Improver: Molecular Adhesive)]

It can be safely said that the adhesiveness improver (compound (α)) of the present invention is a molecular adhesive.

The aforementioned compound (α) has an alkoxysilyl group and an azide group. Preferably, the aforementioned compound (α) further has a triazine ring. Preferably, the azide group is directly bonded to the triazine ring (C atom). The number of the azide groups that have been bonded to the triazine ring is, for example, one or two. Preferably, the OH group or the OH yielding group (for example, alkoxysilyl group) is indirectly bonded to the triazine ring (C atom) via a spacer (for example, an amino group, an oxy group, and/or a hydrocarbon group). The number of the alkoxysilyl groups indirectly bonded to the triazine ring is one, or two or more.

It has become clear that the azide group bonded to the triazine ring (conjugated system) is high in energy of resolution into nitrene. Thus, an influence by near ultraviolet rays and visible light hardly occur. For this, workability of exposure of the ultraviolet rays is improved. It has become clear that the nitrene bonded to the triazine ring is more stable as compared with the nitrene that has not been bonded. It has become clear that the bonding of the nitrene partners is suppressed. It has become clear that hydrogen abstraction activity for the C—H bonds and addition activity for the unsaturated bonds are strengthened.

The aforementioned alkoxysilyl group has been bonded to the triazine ring (conjugated system) via he spacer (for example, an amino group, an oxy group, and/or a hydrocarbon group). For this, when the aforementioned compound (α) is bonded to the polymer surface, an entropy effect for generating the chemical bond is enhanced in a contact with the metal film. An enhancement in the entropy effect causes a frequency factor term in an interface reaction to be increased after contact between the polymer (the aforementioned base) and the metal film (plating film). As a result, an opportunity of the interface reaction is increased. The length of the aforementioned spacer is reflected into an increase in the frequency factor in the interface reaction. When the length of the spacer is too long, the cost becomes higher. And yet, a reduction in an absorption quantity of the molecular adhesive occurs. Thus, the spacer having an appropriate length is desirable. The compounds represented by the aforementioned general formulas [Io], [Ia], and [Ib] were desirable from such a viewpoint.

From a viewpoint of an increase in the frequency factor term in the interface reaction, the more the number of the alkoxysilyl groups and azide groups existing per molecule is, the more preferable it will be. However, its number as well is restrained from a viewpoint of the cost etc. That is, the compounds represented by the aforementioned general formulas [Io], [Ia], and [Ib] were desirable from such a viewpoint.

The alkoxysilyl group in the aforementioned general formulas [Io], [Ia], and [Ib] is an OH yielding group (OH precursor) in almost cases. So as to modify the OH yielding group into the OH group, it is treated with water (neutral water, acid water, and alkaline water). In addition hereto, the corona discharge treatment and the plasma treatment are thinkable. However, the water treatment is desirable.

The compound (α) was synthesized along with the following reaction formula.

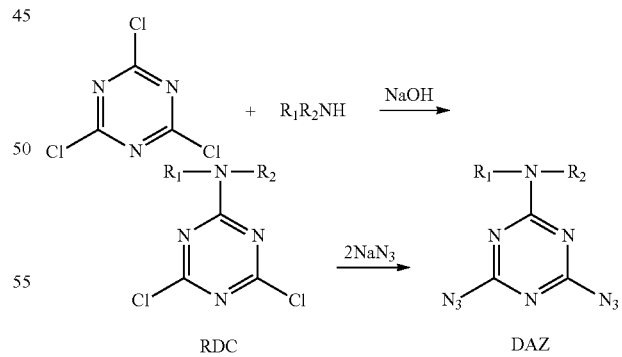

An acetone solution of an amino compound (for example, amino alcohol) containing the hydroxyl group was dripped into an acetone solution of cyanuric chloride under the stirring. The temperature at this time is 0 to 10° C. Thereafter, a NaOH aqueous solution was dripped. With this, RDC was obtained. A DMF aqueous solution of $NaN_3$ was dripped into a dimethyl formamide (DMF) solution of this RDC. The temperature at this time is 40 to 60° C. With this, DAZ was obtained. Alcohol (for example, methanol, ethanol, etc.) may be used instead of the aforementioned acetone.

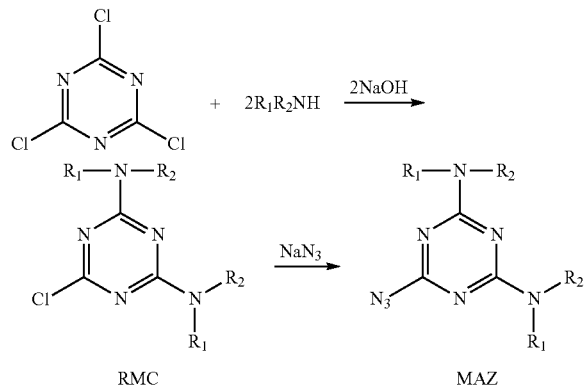

RMC                    MAZ

A THF (tetrahydrofuran) solution of the amino compound (for example, alkoxysilyl alkylamine) containing the hydroxyl group was dripped into a THF solution of cyanuric chloride under the stirring. The temperature at this time is 0 to 50° C. Thereafter, a NaOH aqueous solution was dripped. With this, RMC was obtained. A DMF aqueous solution of NaN₃ was dripped into a DMF solution of this RMC. The temperature at this time is 50 to 70° C. With this, MAZ was obtained. Alcohol (for example, methanol, ethanol, etc.) may be used instead of the aforementioned THF.

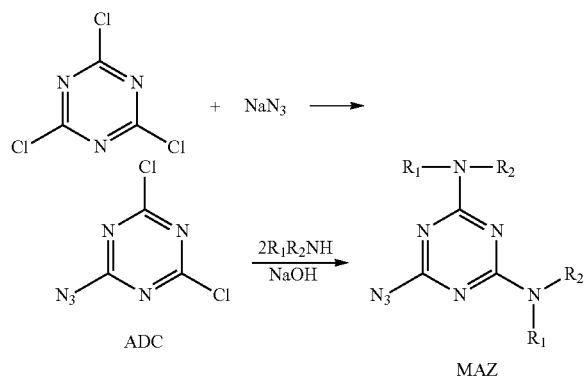

ADC                    MAZ

A NaN₃ aqueous solution was dripped into an acetone solution of cyanuric chloride under the stirring. The temperature at this time is 0 to 5° C. With this, ADC was obtained. The amino compound (for example, amino alcohol) solution containing the hydroxyl group was dripped into an acetone solution of this ADC. The temperature at this time is 40 to 60° C. With this, MAZ was obtained. Alcohol (for example, methanol, ethanol, etc.) may be used instead of the aforementioned acetone.

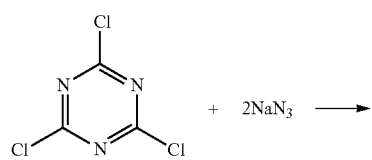

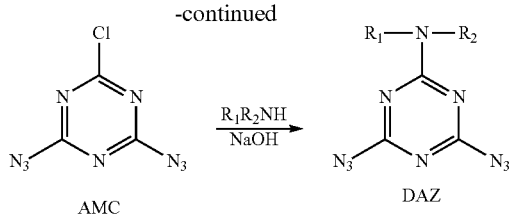

AMC                    DAZ

A NaN₃ aqueous solution was dripped into an acetone solution of cyanuric chloride under the stirring. The temperature at this time is 0 to 10° C. With this, AMC was obtained. The amino compound (for example, amino alcohol) solution containing the hydroxyl group was dripped into an acetone solution of this AMC. The temperature at this time is 0 to 60° C. With this, DAZ was obtained. Alcohol (for example, methanol, ethanol, etc.) may be used instead of the aforementioned acetone.

The aforementioned compound (α) is triazine compounds having an alkoxysilyl group and an azide group. Such a compound is preferably the compounds represented by the aforementioned general formulas [I], [Io], [Ia], and [Ib]. As the compound of this type, for example, 6-azide-2,4-bis(ethanolamino)-1,3,5-triazine, 6-azide-2,4-bis(hexanolamino)-1,3,5-triazine, 6-azide-2,4-bis(decanolamino)-1,3,5-triazine, 6-azide-2,4-bis(3,4-bishydroxyphenyl)amino-1,3,5-triazine, 6-azide-2,4-bis(2,2-dihydroxymethyl)ethylamino-1,3,5-triazine, 6-azide-2,4-bis(tris methanol methyl)methylamino-1,3,5-triazine, 6-azide-2,4-(1,2-dihydroxypropyl)amino-1,3,5-triazine, 6-azide-2,4-bis(3-triethoxysilyl)propylamino-1,3,5-triazine (TE-MAZ), 6-azide-2,4-bis(3-methylethylketoxyminosilyl)propylamino-1,3,5-triazine, 6-azide-2,4-bis(3-methylethylketoxyminosilyl)propylamino-1,3,5-triazine, 6-azide-2,4-bis(3-triisopropoxysilyl)propylamino-1,3,5-triazine, 6-azide-2,4-bis(3-triacetoxysilyl)propylamino-1,3,5-triazine, 6-azide-2,4-bis(3-triisopropoxysilyl)propylamino-1,3,5-triazine, 6-azide-2,4-bis(3-triisopropoxysilyl)propylamino-1,3,5-triazine, 6-azide-2,4-bis(3-tribenzoxysilyl)propylamino-1,3,5-triazine, 6-azide-2,4-bis(diethanolamino)-1,3,5-triazine, 6-azide-2,4-bis(dihexanolamino)-1,3,5-triazine, 6-azide-2,4-bis(didecanolamino)-1,3,5-triazine, 6-azide-2,4-bis(3-triethoxysilylpropyl)amino-1,3,5-triazine, 6-azide-2,4-bis(6-triethoxysilylhexyl)amino-1,3,5-triazine, 6-azide-2,4-bis(10-triethoxysilyldodecyl)amino-1,3,5-triazine, 2,4-diazide-6-(N,N-diethanol)amino-1,3,5-triazine (DEA-DAZ), 2,4-diazide-6-(N,N-didecanol)amino-1,3,5-triazine, 2,4-diazide-6-(3,4-bishydroxyphenyl)amino-1,3,5-triazine, 2,4-diazide-6-(2,2-dihydroxymethyl)ethylamino-1,3,5-triazine, 2,4-diazide-6-(tris methanol methyl)methylamino-1,3,5-triazine, 2,4-diazide-6-(1,2-dihydroxypropyl)amino-1,3,5-triazine, 2,4-diazide-6-(3-triethoxysilylpropyl)amino-1,3,5-triazine (TE-DAZ), 2,4-diazide-6-bis(3-methylethylketoxyminosilyl)propylamino-1,3,5-triazine, 2,4-diazide-6-bis(3-methylethylketoxyminosilyl)propylamino-1,3,5-triazine, 2,4-diazide-6-(3-triisopropoxysilyl)propylamino-1,3,5-triazine, 2,4-diazide-6-(3-triacetoxysilyl)propylamino-1,3,5-triazine, 2,4-diazide-6-(3-triisopropoxysilyl)propylamino-1,3,5-triazine, 2,4-diazide-6-(3-triisopropoxysilyl)propylamino-1,3,5-triazine, 2,4-diazide-6-(3-tribenzoxysilyl)propylamino-1,3,5-triazine, 2,4-diazide-6-bis(dihydroxyethyl)amino-1,3,5-triazine, 2,4-diazide-6-(N,N-dihexanol)amino-1,3,5-triazine, 2,4-diazide-6-(N,N-didecanol)amino-1,3,5-triazine, 2,4-diazide-6-(N,N-bis(3-triethoxysilylpropyl)amino-1,3,5-triazine (BTE-DAZ), 2,4-diazide-6-(N,N-bis(6-triethoxysilylhexyl)amino- 1,3,5-triazine, 6-(11-triethoxysilylundecyl)amino-1,3,5-triazine-2,4-diazide (TEU-DAZ), 6-(3-diethoxymethylsilylpropyl)amino-1,3,5-triazine-2,4-diazide (DEM-DAZ), 6-(4-triethoxysilylbutyl)amino-1,3,5-triazine-2,4-diazide (TEB-DAZ), and the like can be listed.

[Base (Polymer)]

The base is configured of a polymer (resin). The aforementioned polymer has, for example, a C—H bond or a Si—C bond. In particular, the aforementioned polymer has the C—H bond. The aforementioned polymer is curing resin (for example, thermosetting resin, photo-curing resin and electron-beam curing resin). Or, the aforementioned polymer is thermoplastic resin. Or, the aforementioned polymer is fiber-reinforced resin. Or, the aforementioned polymer is rubber and vulcanized rubber. In addition to these, the material having a coating film containing a polymer formed on the surface thereof may be used. The aforementioned polymer has a two-dimensional linear structure. Or, the aforementioned polymer has a three-dimensional net structure. The shape of the base is governed by applications. For example, the shapes such as a film shape, a sheet shape, a plate shape, a column shape, a bar shape, a frame shape, a box shape, a fiber shape, a yarn shape, a cloth shape, an unwoven cloth shape and a foam shape can be listed.

As specific examples of the aforementioned polymer etc., for example, cellulose and its derivatives, hydroxyethyl cellulose, starch, cellulose diacetate, surface saponified vinyl acetate resin, low-density polyethylene, high-density polyethylene, polypropylene, ethylene-propylene copolymer, petroleum resin, polystyrene, syndiotactic-polystyrene, styrene copolymer, chroman-indene resin, terpene resin, styrene-divinyl benzen copolymer, acrylnitrile-butadiene-styrene copolymer resin, polymethyl acrylate, polyethyl acrylate, polyacryl nitrile, polymethyl acrylate, polymethyl methacrylate, polyethyl methacrylate, polycyano acrylate, polyvinyl acetate, ethylene-vinyl acetate copolymer resin, polyvinyl alcohol, polyvinyl formal, polyvinyl acetal, vinyl acetate copolymer, polyvinyl chloride, vinyl chloride-vinyl acetate copolymer, vinyl chloride-ethylene copolymer, poly (vinyliden fluoride), vinyliden fluoride-ethylene copolymer, vinyliden fluoride-propylene copolymer, poly1,4-transpolybutadiene, poly1,2-transpolybutadiene, polyoxy methylene, polyethylene glycol, polypropylene glycol, phenolformalin resin, cresol-formalin resin, resorcinol resin, melamine resin, xylene resin, toluene resin, glyptal resin, modified glyptal resin, polyethylene terephthalate, polybutylene terephthalate, unsaturated polyester resin, polyester acrylate, allylester resin, polycarbonate, 6-nylon, 6',6-nylon, 6',10-nylon, polyimide, polyamide, polybenzimidazole, polybenzoxazole, polybenzothiazole, polyamideimide, silicon resin, addition-curable type silicone rubber, polymerization-curable type silicone rubber, condensation-curable type silicone rubber, addition-curable type silicone resin, furan resin, polyurethane resin, epoxy resin, polyphenylene oxide, polydimethylphenylene oxide, blend polymers (polymer alloys) of polyphenylene oxide or polydimethylphenylene oxide and triallylisocyanuric acid, blend polymers (polymer alloys) of polyphenylene oxide or polydimethylphenylene oxide and triallylisocyanurate peroxide, polyxylene, polyphenylene sulfide, polycycloolefin, polysulfone, polyethersulfone, polyetheretherketone, polyimide, liquid crystal resin (LCP), natural rubber, 1,4-cisbutadiene rubber, isoprene rubber, polychloroprene, styrene-butadiene copolymer rubber, hydrogenated styrene-butadiene copolymer rubber, acrylnitrile-butadiene copolymer rubber, hydrogenated acrylnitrile-butadiene copolymer rubber, polybutene rubber, polyisobutylene rubber, ethylene-propylene rubber, ethylene-propylene-diene rubber, ethylene oxides-epichlorohydrin copolymer rubber, chlorinated polyethylene rubber, chlorosulfonated polyethylene rubber, alkylated chlorosulfonated polyethylene rubber, chloroprene rubber, chlorinated acryl rubber, brominated acryl rubber, flourine rubber, epichlorohydrin copolymer rubber, chlorinated ethylene-propylene rubber, chlorinated buthyl rubber, brominated buthyl rubber, tetrafluoroethylene, hexafluoropropylene, homopolymer ruber such as vinylidene fluoride and tetrafluoroethylene, and copolymer rubber and terpolymer rubber thereof, ethylene-tetrafluoroethylene copolymer rubber, propylene-tetrafluoroethylene copolymer rubber, ethyleneacryl rubber, peroxide type silicone rubber, addition type silicone rubber, condensation type silicone rubber, epoxy rubber, urethane rubber, elastomers having unsaturated groups at both terminals, and the like can be listed.

The aforementioned base (polymer) includes various kinds of additives (for example, crosslinking agents, crosslinking accelerators, crosslinking assistants, radical initiators, cation initiators, photopolymerization initiators, scorch retarders, stabilizers, antioxidants, ultraviolent ray inhibitors, fillers, reinforcers, plasticizers, softeners, colorants, and viscosity modifiers) according to a necessity.

The aforementioned polymer having the three-dimensional net structure is obtained by subjecting to heating or light irradiation a composite obtained by, for example, adding the crosslinking agent (in addition, the crosslinking accelerator and the crosslinking assistant) to the aforementioned two-dimensional linear polymer. Or, the aforementioned polymer is obtained by subjecting to heating or light irradiation a composite obtained by, for example, adding the crosslinking agent (in addition, the crosslinking accelerator and the crosslinking assistant) to a predetermine monomer (for example, a low molecular monomer having a vinyl group, an acrylate group, a methacrylate group, an epoxy group, an isocyanate group, or an oxetane group of which the number is one, or two or more per molecule).

As the aforementioned monomers, for example, a urethane acrylate-based, an epoxy acrylate-based, an ester acrylate-based, an acrylate-based, an epoxy-based, and a vinyl ether-based monomers can be listed. Specifically, acrylates (for example, ethylene glycol di(metha)acrylate, propylene glycol di(metha)acrylate, polyethylene glycol di(metha)acrylate, 1,4-butanediol di(metha)acrylate, 1,6-hexanediol di(metha)acrylate, trimethylolpropane tri(metha) acrylate, pentaerythritol tetra(metha)acrylate, epoxy (metha) acrylate obtained by an addition reaction with (metha) acrylic acid, polyurethane (metha)acrylate obtained by a reaction with 2-hydroxyethyl (metha)acrylate, diol, and diisocyanate, polyester (metha)acrylate polyester acrylate obtained by a reaction with (metha) acrylic acid, polycarboxylic acid, and polyol, urethane acrylate, epoxy acrylate, polyether acrylate, and polyol acrylate), and methacrylates (for example, polyester methacrylate, urethane methacrylate, epoxy methacrylate, polyether methacrylate, and polyol methacrylate) can be listed. In addition hereto, n-alkyl acrylate, i-propyl acrylate, i-butyl acrylate, t-butyl acrylatc, cyclohexyl acrylate, β-hydroxyethyl acrylate, diethylene glycol acrylate, polyethylene glycol acrylate, β-hydroxypropyl acrylate, glycidyl acrylate, ethylene glycol diacrylate, diethylene glycol diacrylate, triethylene glycol diacrylate, polyethylene glycol diacrylate, dialkylamino ethyl acrylate, 2-cyanoethyl acrylate, ⊕-ethoxyethyl acrylate, aryl acrylate, benzoyloxyethyl acrylate, benzyl acrylate, phenoxyethyl acrylate, phenoxydiethylene glycol acrylate, 2-hydroxy-3-phenoxypropyl acrylate, tetrahydrofurfuryl acrylate, addition product acrylates of tetrahydrofurfuryl alcohol and ε-caprolactone, i-bornyl acrylate, dicyclopentenyloxyethyl acrylate, 1,4-butanediol diacrylate, 1,6-hexanediol diacrylate, 1,9-nonandiol diacrylate, neopentyl glycol diacrylate, triethylene glycol diacrylate, tetraethylene glycol diacrylate, polyethylene glycol diacrylate, tripropylene glycol diacrylate, hydroxypivalic acid neopentyl glycol diacrylate, acetal glycol diacrylate, addition product diacrylate of hydroxypivalic acid neopentyl glycol and ε-caprolactone, trimethylolpropane triacrylate, trimethylolpropane•polyethoxylate•triacrylate, trimethylolpropane•polyproxylate•triacrylate, pentaerythritol triacrylate, dipentaerythritol hexaacrylate, addition product hexaacrylates of dipentaerythritol and ε-caprolactone, acryloxyethyl phosphate, fluoroalkyl acrylate, sulfopropyl acrylate, methyl methacrylate, ethyl methacrylate, propyl methacrylate, i-propyl methacrylate, butyl methacrylate, isobutyl methacrylate, sec-butyl methacrylate, t-butyl methacrylate, hexyl methacrylate, octyl methacrylate, i-octyl methacrylate, 2-ethylhexyl methacrylate, decyl methacrylate, lauryl methacrylate, stearyl methacrylate, 2-hydroxyethyl methacrylate, 2-hydroxypropyl methacrylate, 2-dimethylamino ethyl methacrylate, 2-diethylamino ethyl methacrylate, 2-t-butylamino ethyl methacrylate, glycidyl methacrylate, allyl methacrylate, cyclohexyl methacrylate, phenyl methacrylate, nonylphenyl methacrylate, benzyl methacrylate, dicyclopentenyl methacrylate, bornyl methacrylate, 1,4-butanediol dimethacrylate, 1,3-butanediol dimethacrylate, ethylene glycol dimethacrylate, diethylene glycol dimethacrylate, triethylene glycol dimethacrylate, tetraethylene glycol dimethacrylate, polyethylene glycol dimethacrylate, neopentyl glycol dimethacrylate, 1,6-hexanediol dimethacrylate, dipropylene glycol dimethacrylate, trimethylolpropane trimethacrylate, glycerol methacrylate, methacryloxyethyl phosphate, bis•methacryloxyethyl phosphate, arone oxetane, di[1-ethyl(3-oxetanyl)]methyelether, 3-ethyl-3-(hexyloxymethyl)oxetane, xylylene dioxetane, phenyl oxetane, oxetanyl silsesquioxane, 3-ethyl-3-(heptyloxymethyl)oxetane, 3-ethyl-3-(2-ethyl hexyloxymethyl)oxetane, 3-ethyl-3-(octyloxymethyl)oxetane, 3-ethyl-3-(dodecyloxymethyl)oxetane, bisphenol A type epoxy monomer, bisphenol F type epoxy monomer, novolac-type epoxy monomer, toluene diisocyanate, and the like can be listed.

Various types are used for the aforementioned polymerization initiator, crosslinking agent, crosslinking accelerator, and crosslinking assistant. For example, peroxides, cation polymerization initiators, photopolymerization initiators, sulfur, sulfur-based crosslinking accelerators, polyol-based crosslinking agents, polyamine-based crosslinking agents, polythiol-based crosslinking agents, acrylate-based crosslinking assistants, methacrylate-based crosslinking assistants, and allyl-based crosslinking assistants can be listed. Specifically, for example, azobisisobutyronitrile, benzo phenon, Michler's ketone, benzoin isopropyl ether, chlorothioxanthone, isopropylthioxanthone, benzyldimethyl ketal, acetophenonediethyl ketal, α-hydroxycyclohexyl phenylketone, and 2-hydroxy-2-methyl-phenylpropane can be listed. Acetophenone derivative compounds (for example, 4-(2-hydroxyethoxy)phenyl(2-hydroxy-2-propyl)ketone, α-hydroxy-α,α'-dimethylacetophenone, methoxyacetophenone and 2,2-dimethoxy-2-phenylacetophenone) can be also listed. Benzoin ether-based compounds (for example, benzoin ethyl ether and benzoin proply ether) can be also listed. Ketal derivative compounds such as benzyldimethyl ketal can be also listed. Halogenated ketone, acylphosphine oxide, acylphosphonate, bis(2,6-dimethoxybenzoyl)-2,4,4-trimethylpentyl phosphine oxide, phenyl dimethyl sulfonium chloride, and triaryl sulfonium hexafluoro phosphate can be also listed. Triazinedithiol-based crosslinking agents, resin crosslinking agents, polyol crosslinking agents, H-terminal siloxane-based crosslinking agents, and silanol condensation type crosslinking agents can be listed. Dibenzothiazoyl disulfide, 4-morpholino dithio benzothiazole, N-cyclohexyl-2-benzothiazoyl sulfenamide, N-t-butyl-2-benzothiazoyl sulfenamide, N-oxydiethylene-2-benzothiazoyl sulfenamide, N-diisopropyl-2-benzothiazoyl sulfenamide, N-dicyclohexyl-2-benzothiazoyl sulfenamide, tetramethyl thiuram disulfide, tetraethyl thiuram disulfide, tetrabutyl thiuram disulfide, tetraoctyl thiuram disulfide, amines, hexamethylene tetramine, saligen, quaternary ammonium salts, phosphonium salts, dialkyl tin organic acid salts, titanate, polyethylene glycol, chloroplatinic acid, zinc oxide, magnesium oxide, calcium oxide, barium oxide, aluminum oxide, calcium hydroxide, tin oxide, iron oxide, calcium hydroxide, calcium carbonate, magnesium carbonate, fatty acid sodium, calcium octylate, potassium isooctylate, potassium butoxide, cesium octylate, potassium isostearate, polyethylene glycol, polypropylene glycol, hexanediol, cyclohexanediol, dodecanediol, hexamethylene diamine, dodecane diamine, polyethylene glycol containing diamino at terminals, polypropylene glycol containing diamino at terminals, benzenedithiol, hexanedithiol, 1,10-decanedithiol, 1,12-dodecanedithiol, polyethylene glycol diacrylate, polyethylene glycol dimethacrylate, polypropylene glycol diacrylate, polypropylene glycol dimethacrylate, diallyl ether, triallyl isocyanurate, and triallyl cyanurate can be also listed.

The base made of the polymer having the two-dimensional linear structure (thermoplastic resin, un-crosslinked rubber) and the polymer having the three-dimensional net structure (heat-curable resin, crosslinked rubber) each of which is a high polymerized material is obtained by performing a roll sheeting work, a calendar rolling work, a pressing work, an extruding work, or an injection molding work for a composite obtained by adding 0.1 to 20 parts by weight of the crosslinking agent, 0.1 to 20 parts by weight of the crosslinking accelerator, and 0.1 to 20 parts by weight of the crosslinking assistant to 100 parts by weight of the two-dimensional linear structure polymer (or monomer) under conditions of a temperature of 20 to 350° C. and a working time of 0.1 second to 200 minutes. However, an adding amount of the crosslinking agent etc., the working temperature, and the working time differ depending on special features of working machines. Additionally, when the polymer having the two-dimensional linear structure or thermoplastic resin is employed, the crosslinking agent may not be added.

When the base is configured of the photo-curing resin, UV devices (for example, high-pressure mercury UV lamps, low-pressure mercury UV lamps, fluorescence type UV lamps (short ARC xenon lamps and chemical lamps) and metal halide lamps) are used, and the base is obtained by irradiating the composite with the ultraviolent rays having a wavelength of 200 to 450 nm in a desired environment (for example, in the air, in a nitrogen atmosphere, in an argon atmosphere, or under depressurization). The light intensity of irradiation is, for example, 1 mJ/m$^2$ to 20 J/m$^2$. The composites to be irradiated with the ultraviolent rays are appropriately selected. For example, the above composite is a composite containing 100 part by weight of the epoxy-based compound and 0.01 to 5 parts by weight of the photo polymerization catalyst.

The vulcanized rubber is obtained by keeping the composite containing one kind, or two kinds or more of elastomers selected from a group of linear copolymers of which a glass transition temperature is equal to less than −20° C., and the additives (for example, the crosslinking agent, the crosslinking accelerator and the like) for 0.1 to 1200 minutes and at a temperature of 0 to 300° C. The addition type silicone rubber, the condensation type silicone rubber and the like are obtained with long-time heating at a low temperature in some cases. In general, the temperature is 60 to 180° C. in many cases.

The aforementioned base contains an appropriate amount of various types of fillers and reinforcers according to a necessity. For example, various types of carbon blacks, calcium carbonate, talc, clay, kaolin, glass, wet silica, and dry silica are contained according to a necessity. Rayon, nylon, polyester, vinylon, steel, Kevlar fibers, carbon fibers, and glass fibers, and clothes are contained according to a necessity. Metal particles (copper, nickel, silver, gold, tin and the like) are contained according to a necessity. Carbon particles are contained according to a necessity. Conductive materials are contained according to a necessity. Heat-transfer materials such as alumina, silicon nitride, alumina nitride, silicon carbide, and diamond are contained according to a necessity. The containing amount is 200 parts or less by weight per 100 parts by weight of the polymer. In general, the containing amount is 100 parts or less by weight. However, 200 parts or more by weight are contained according to a necessity in some cases.

The aforementioned base contains an appropriate amount of stabilizers according a necessity. The stabilizers are, for example, antioxidants or ultraviolent ray absorbers. For example, the stabilizers are amine ketone-based condensation products such as poly(2,2,4-trimethyl-1,2-dihydroquinoline) and 6-ethoxy-1,2-dihydro-2,2,4-trimethylquinoline. The stabilizers are secondary aromatic amine compounds such as octyldiphenylamine, 4,4-bis(α,α-dimethylbenzyl) diphenylamine, N,N-diphenyl-p-phenylenediamine, N-phenyl-N'-isopropyl-p-phenylenediamine, and N-phenyl-N'-isopropyl-1,3-dimethylbutyl-p-phenylenediamine.
Monophenol-based or bisphenol-based compounds such as styrenated phenol, 2,6-di-t-butyl-4-phenol, 2-t-butyl-6-(3-t-butyl-2-hydroxy-5-methylbenzyl)-4-methylphenylacrylate, 2,2-methylenebis(4-methyl-6-t-butylphenol), 4,4-thiobis(3-methyl-6-t-butylphenol)2,5-di-t-butylhydroquinone. Sulfuric or phosphorus compounds such as 2-mercapto benzimidazole, 2-zinc mercapto benzimidazole, nickel dimethyl dithio carbamate, 1,3-bis(dimethylaminopropyl)thiourea, dilauryl-3,3-thiodipropionate, and tris(nonylated phenyl) phosphite. The containing amount is 30 parts or less by weight per 100 parts by weight of the polymer. In general, the containing amount is 0.5 to 5 parts by weight.

The aforementioned base contains an appropriate amount of the following compounds according to a necessity. For example, the ultraviolet ray absorbers such as 2-ethylhexyl paramethoxy cinnamate (octyl), 2-ethylhexyl paradimethylamino benzoate (octyl), oxybensone(benzophenone3), 2-ethylhexyl salicylate (octyl), 4-tert-butyl-4-methoxybenzoylmethane, benzoate-based stabilizers, and hindered amine-based light stabilizers are contained. The containing amount is 10 parts or less by weight per 100 parts by weight of the polymer. In general, the containing amount is 0.1 to 2 parts by weight.

The aforementioned base contains an appropriate amount of softeners, plasticizers, processing aids, viscosity modifies and colorants according to a necessity, respectively.

[Surface Treatment of the Base]

At first, the solution having aforementioned compound (α) dissolved (or dispersed) therein is prepared. As solvents to be employed, water, alcohols (for example, methanol, ethanol, isopropanol, ethylene glycol, propylene glycol, cellosolve and carbitol), ketones (for example, acetone, methyl ethyl ketone and cyclohexanone), aromatic hydrocarbons (for example, benzene, toluene and xylene), aliphatic hydrocarbons (for example, hexane, octane, decane, dodecane and octadecane), esters (for example, ethyl acetate, methyl propionate and methyl phthalate), ethers (for example, tetrahydrofuran, ethyl butyl ether, and anisole), and the like can be listed. Mixtures of the aforementioned compounds may be also used. The containing amount of the aforementioned compound (α) is 0.0001 to 10% by weight. Particularly preferably, it is 0.001 to 2% by weight. The reason is that when the containing amount of the aforementioned compound (α) is too few, its effect is scanty. To the contrary, it does not make sense that the containing amount is too much because the amount of the reaction with the base is limited. The above-mentioned ratio was preferred from such a viewpoint.

Surfactants are added to the aforementioned solution (dispersion) according to a necessity from a viewpoint of adjusting surface tension. For example, nonionic surfactants (for example, nonionic surfactants that are comprised of long-alkyl chains and polyethylene glycol), cationic surfactants (for example, quaternary ammonium salts), or anionic surfactants (for example, organic carboxylate and sulfonate) are employed.

The base is immersed into the aforementioned solution (dispersion). Or, the aforementioned solutions (dispersions) are sprayed onto the base. This allows the aforementioned adhesiveness improver (the aforementioned compound (α): molecular adhesive) to stick to the base surface.

Thereafter, light (ultraviolent rays) is radiated. In particular, only locations in which the aforementioned compound (α) should be bonded to the aforementioned base are irradiated with light. For this, an appropriate pattern mask is used. With the aforementioned ultraviolent ray irradiation, the azide group of the aforementioned compound (α) is dissolved. Dissolution of the azide group allows nitrene to be generated. This nitrene attacks the functional groups (for example, $—CH_3$, $—CH_2—$, and $—CH<$, $—CH=CH—$) existing on the aforementioned base surface. And, a hydrogen-abstraction radical addition reaction or a radical addition reaction occurs, and the chemical bonding between the aforementioned compound (α) and the base surface is yielded. No chemical bonding occurs in the not-irradiated locations.

UV devices (for example, high-pressure mercury UV lamps, low-pressure mercury UV lamps, fluorescence type UV lamps (short ARC xenon lamps and chemical lamps) and metal halide lamps) are employed for the ultraviolet ray irradiation. And the ultraviolet rays having a wavelength of 200 to 450 nm are radiated. When the light intensity of irradiation is too few, the reaction hardly progresses. To the contrary, when the light intensity of irradiation is too much, there is an anxiety over deterioration in the base. Thus, the preferable light intensity of irradiation (wavelength 254 nm) is 1 mJ/m$^2$ to 5 J/m$^2$. More preferably, it is 5 mJ/m$^2$ to 1 J/m$^2$.

When the base is complicatedly shaped, so as to uniformly irradiating the base with UV, use of reflection plates is effective. As the reflection plates, for example, mirrors, surface-polished metal foil, Al mirror surface foil, SUS mirror surface foil and silver plating mirror surface plates can be listed. Shape, size and materials of the reflection plate, and the like are appropriately selected from a viewpoint of reflection efficiency.

The aforementioned base subjected to the ultraviolent ray irradiation is treated with water. For example, it is immersed into water. Water is preferably an acid aqueous solution or an alkaline aqueous solution. For example, the base is immersed into a 0.0001% to 10% (preferably, 0.01% to 5%) acid aqueous solution for 0.1 to 60 minutes (preferably, 1 to 20 minutes). This allows the alkoxysilyl group to be modified into the hydroxylsilyl group. The aforementioned conditions of the numerical value are decided from a viewpoint of efficiency of the modification of the alkoxysilyl group into the hydroxylsilyl group.

The polymer having the aforementioned general formula [II] is preferably used together with the aforementioned compound (α). That is, using the polymer having the aforementioned general formula [II] together with the aforementioned compound (α) causes the number of —OH existing on the base surface to be increased. That is, the polymer containing the alkoxy group having the aforementioned general formula [II] is employed, thereby causing the number of —OH existing on the base surface to be increased.

The treatment by the aforementioned polymer containing the alkoxy group is performed similarly to the treatment by the aforementioned compound (α). That is, the base is treated with the solution containing the polymer having the aforementioned general formula [II] (for example, dissolved or dispersed). As the solvents to be employed for the aforementioned treatment, water, alcohols (for example, methanol, ethanol, isopropanol, ethylene glycol, propylene glycol, cellosolve and carbitol), ketones (for example, acetone, methyl ethyl ketone and cyclohexane), aromatic hydrocarbons (for example, benzene, toluene and xylene), aliphatic hydrocarbons (for example, hexane, octane, decane, dodecane and octadecane), esters (for example, ethyl acetate, methyl propionate and methyl phthalate), ethers (for example, tetrahydrofuran, ethyl butyl ether, and anisole), and the like can be listed. Mixtures of the aforementioned compounds may be also used. The containing amount of the aforementioned polymer containing the alkoxy group is 0.0001 to 10% by weight. Particularly preferably, it is 0.001 to 5% by weight. The reason is that when the containing amount of the aforementioned polymer is too few, its effect is scanty. After the treatment by the aforementioned polymer, the base is subjected to heat treatment at a temperature of 0 to 200° C. (preferably, 20 to 150° C.) and for 0.1 to 60 minutes (preferably, 1 to 20 minutes).

Further, the treatment by the compounds represented by the aforementioned general formulas [T] and [III] or/and [IV] in addition to the use of the aforementioned compound (α) is also preferable. That is, using the compounds represented by the aforementioned general formulas [T] and [III] or/and [IV] together with the aforementioned compound (α) causes the number of —OH existing on the base surface to be increased. In addition, reactive functional groups are introduced.

The treatment by the compounds represented by the aforementioned general formulas [T] and [III] and/or [IV] is performed similarly to the treatment by the aforementioned compound (α). That is, the base is treated with the solution (dissolved or dispersed) containing the compounds represented by the aforementioned general formulas [T] and [III] and/or [IV]. As the solvents to be employed for the aforementioned treatment, water, alcohols (for example, methanol, ethanol, isopropanol, ethylene glycol, propylene glycol, cellosolve and carbitol), ketones (for example, acetone, methyl ethyl ketone and cyclohexane), aromatic hydrocarbons (for example, benzene, toluene and xylene), aliphatic hydrocarbons (for example, hexane, octane, decane, dodecane and octadecane), esters (for example, ethyl acetate, methyl propionate and methyl phthalate), ethers (for example, tetrahydrofuran, ethyl butyl ether, and anisole), and the like can be listed. Mixtures of the aforementioned compounds may be also used. The containing amount of the compound represented by the aforementioned general formula [III] or [IV] is 0.0001 to 10% by weight. Particularly preferably, it is 0.001 to 5% by weight. The reason is that when the containing amount of the aforementioned compound is too few, its effect is scanty. After the treatment by the compounds represented by the aforementioned general formulas [T] and [III] or [IV] the base is subjected to heat treatment at a temperature of 0 to 200° C. (preferably, 20 to 150° C.) and for 0.1 to 60 minutes (preferably, 1 to 20 minutes).

In the present invention, in the step (U), for example, the coupling agent having the alkoxysilyl group may be employed. With this, various functional groups are introduced into the base surface. As the coupling agents of this type, for example, 6-alkoxysilylpropylamino-1,3,5-triazine-2,4-dithiol monosodium, 6-bis(3-alkoxysilylpropyl)amino-1,3,5-triazine-2,4-dithiol monosodium, 6-N-cyclohexyl-N-(3-(triethoxysilyl)propylamino)-1,3,5-triazine-2,4-dithiol monosodium, vinylmethoxy siloxane homopolymer, bis(triethoxysilylpropyl)tetrasulfide, 3-mercaptopropyl trimethoxysilane, 3-aminopropyl triethoxysilane, 6-alkoxysilylpropylamino-1,3,5-triazine-2,4-dithiol, 3-alkoxysilylpropyl amine, bis(3-alkoxysilylpropyl)amine, 6-N-cyclohexyl-N-3-(triethoxysilyl)propylamine, 3-aminopropyl triethoxysilane, (3-acryloxypropyl)trimethoxysilane, methacryloxypropyl trimethoxysilane, triethoxysilyl undecanal, 4-aminobutyl triethoxysilane, m-aminophenyl triethoxysilane, 11-aminoundecyl trimethoxysilane, N-(3-triethoxysilylpropyl)pyrrole, N-(2-aminoethyl)-3-aminopropyl trimethoxysilane, 3-aminopropylmethyl diethoxysilane, aminopropylsilanetriol, N-(2-aminoethyl)-3-aminopropylsilanetriol, N-methylaminopropyl trimethoxysilane, N-butylaminopropyl trimethoxysilane, N-trimethoxysilylpropyl trimethyl ammonium chloride, bis(trimethoxysilylpropyl)amine, 3-(triethoxysilyl)propyl succinic anhydride, 6-azide sulfonylhexyl triethoxysilane, 2-(4-chlorosulfonyl) ethyltriethoxysilane, 2-(3,4-epoxycyclohexyl) trimethoxysilane, (3-glycidioxypropyl)trimethoxysilane, 10-(carbomethoxy)decyl dimethyl methoxysilane, 3-chloropropyl trimethoxysilane, 7-bromoheptyl trimethoxysilane, 3-isocyanatopropyl triethoxysilane, (3-triethoxysilyl)-t-butylcarbamate, 2-(diphenylphosphino)ethyl triethoxysilane, diethylphosphate ethyltriethoxysilane, 3-mercaptopropyl trimethoxysilane, 5-(bicycloheptinyl)triethoxysilane, (3-cyclopentadiene-1yl-propyl)triethoxysilane, and the like can be listed.

The treatment by these coupling agents is also performed similarly to the treatment by the aforementioned compound (α) and the treatment by the aforementioned polymer containing the alkoxy group. As the solvents to be employed, for example, water, alcohols (for example, methanol, ethanol, isopropanol, ethylene glycol, propylene glycol, cellosolve and carbitol), ketones (for example, acetone, methyl ethyl ketone and cyclohexane), aromatic hydrocarbons (for example, benzene, toluene and xylene), aliphatic hydrocarbons (for example, hexane, octane, decane, dodecane and octadecane), esters (for example, ethyl acetates, methyl propionate and methyl phthalate), ethers (for example, tetrahydrofuran, ethyl butyl ether, and anisole), and the like can be listed. The containing amount of the aforementioned coupling agents is 0.0001 to 10% by weight. Particularly preferably, it is 0.001 to 5% by weight. The reason is that when the containing amount of the aforementioned coupling agents is too few, its effect is scanty. After the treatment by the aforementioned coupling agents the base is subjected to heat treatment at a temperature of 0 to 200° C. (preferably, 20 to 150° C.) and for 0.1 to 60 minutes (preferably, 1 to 20 minutes).

[Metal Film (Plating Film)]

The metal film is formed on the base to which the compound (α) has been applied in a predetermined pattern. The technique of the wet-type plating such as the electronless plating and the electroplating is adopted for forming the metal film. The solution (electroless plating solution or the electroplating solution) containing metal components (metal ions) of the aforementioned film is employed for forming the metal film with this wet-type plating.

Prior to the aforementioned electroless plating step or electroplating step, in general, the treatment by a metal catalysts solution is performed. After the metal catalysts are added, the electrical conductivity step may be employed. The aforementioned metal catalyst solution contains, for example, halides (chlorides, bromides and iodides) with one kind of metal, or two kinds of metals or more (for example, Sn, Pd, Ag, Au, Sn/Pd, Ag/Pd, and Sn/Ag/Pd). In addition hereto, for example, HCl and the like are contained. Cu ion is contained. The base to which the aforementioned compound (α) has been applied is immersed into the aforementioned metal catalyst solution. The treatment condition is, for example, a temperature of 0 to 80° C. (preferably, 20 to 50° C.) and a time of one to five minutes. This treatment to be performed prior to the electroplating and the electroless plating is publicly known, so its detailed explanation is omitted. This pretreatment is not limited only to the publicly known technology.

Metal salts and reducing agents are contained in the electroless plating solution. As the electroless plating solution, for example, an electroless Ni—P plating solution, an electroless Ni—B plating solution, an electroless Ni—P composite plating solution, an electroless copper formalin solution, an electroless copper glyoxylate solution, an electroless copper hypophosphite solution, an electroless palladium plating solution, an electroless gold plating solution, and an electroless cobalt plating solution are known. Needless to say, the electroless plating solution is not limited hereto.

The so-called metal salts contained in the aforementioned electroless plating solution are, for example, metal salts of silver, copper, gold, zinc, nickel, cobalt, iron, palladium, platinum, brass, tin, molybdenum, tungsten, permalloy, steel, and the like. Specifically, $KAu(CN)_2$, $KAu(CN)_4$, $Na_3Au(SO_3)_2$, $Na_3Au(S_2O_3)_2$, $NaAuCl_4$, $AuCN$, $Ag(NH_3)_2NO_3$, $AgCN$, $AgNO_3$, $CuSO_4.5H_2O$, $CuEDTA$, $NiSO_4.7H_2O$, $NiCl_2$, $Ni(OCOCH_3)_2$, $CoSO_4$, $CoCl_2$, $SnCl_2.7H_2O$, $PdCl_2$, and the like can be listed. The concentration of the metal salt is 0.001 to 10 mol/L (preferably, 0.01 to 1 mol/L).

The aforementioned reducing agent is a compound having an operation for generating the metals by reducing the aforementioned metal salts. Specifically, $KBH_4$, $NaBH_4$, $NaH_2PO_2$, $(CH_3)_2NH.BH_3$, $NH_2NH_2$, $H_2NNH_2.H_2O_4S$, $H_2NNH_2.HCl$, $H_2NNH_2.2HCl$, $H_2NNH_2.CH_3COOH$, hydroxylamine salts, N,N-ethylglycine, glycol soda, glyoxylate, glucose, formaldehyde, vanillin and the like can be listed. The concentration of the reducing agent is 0.001 to 5 mol/L (preferably, 0.01 to 1 mol/L).

Various additives such as complexing agents and pH adjusters are contained in addition to the aforementioned metal salts and reducing agents. For example, the additives are contained from a viewpoint of stability (life) of the electroless plating solution and efficiency of the reduction. Specifically, basic compounds, inorganic salts, organic acid salts, citrates, acetates, borates, carbonates, ammonia hydroxide, EDTA, diamino ethylene, sodium tartrate, ethylene glycol, diethylene glycol, triethylene glycol, polyethylene glycol (molecular weight: 200 to 400), thiourea, triazinethiol, triethanol amine and the like can be listed. The concentration of the additives is 0.00001 to 10 mol/L (preferably, 0.0001 to 1 mol/L).

The metal salts are contained in the electroplating solution. As the electroplating solution, for example, a copper sulfate standard plating solution, a copper sulfate high-slow plating solution, a copper cyanide plating solution, a bright copper cyanide plating solution, a copper cyanide strike plating solution, a copper pyrophosphate standard plating solution, a copper pyrophosphate print-board plating solution, a copper pyrophosphate decorative plating solution, a nickel standard plating solution, a nickel watt plating solution, a bright nickel standard plating solution, a nickel sulfamate plating solution, a hexavalent chromium standard plating solution, a trivalent chromium standard plating solution, a zinc alkaline plating solution, a zinc chloride plating solution, a zinc cyanide plating solution, a tin sulfate plating solution, a tin methanesulfonate plating solution, an alkaline tin plating solution, a neutral tin plating solution, a weak acid gold plating solution, a strong acid gold plating solution, a neutral gold plating solution, an alkaline cyanide gold plating solution, an alkaline sulfite gold plating solution, a silver strike plating solution, a silver cyanide plating solution, a silver thiosulfate plating solution, a silver succinate plating solution, a platinum plating solution, a rhodium plating solution, a palladium plating solution, and the like are known. Needless to say, the electroplating solution is not limited hereto.

Additives such as mineral acids, alkali, leveling agents, brighteners and inhibitors are contained in the electroplating solution in addition to the aforementioned metal salts. Specifically, the additives are sulfuric acid, hydrochloric acid, boric acid, sodium cyanide, caustic potash, ammonia, potassium nitrate, potassium pyrophosphate, rochelle salts, potassium thiocyanide, saccharin, coumarin, benzenesulfonic acid, p-toluenesulfonic acid, allylsulfonic acid, ethylene cyanohydrin, pyridinium propyl sulfonate, naphthalenesulfonic acid, 1,4-butanethiol, lead compounds, sodium gluconate, oxycarboxylic acid, surfactants, ethylene glycol, diethylene glycol, triethylene glycol, polyethylene glycol (molecular weight: 200 to 600) and the like.

The temperature (bath temperature) at which the electroplating treatment is performed is, for example, 20 to 100° C. (preferably, 20 to 70° C.). An electric current is, for example, 0.1 to 15 A/dm$^2$ (preferably, 1 to 7 A/dm$^2$).

When the board substrates are manufactured by employing the present invention, it is simple to form the metal films such as Cu wiring film. The reason is that it is easy to form the pattern of the aforementioned compound (α) applied onto the substrate (base). And yet, the reason is that the metal film formed by the technique of the wet-type plating can be easily removed in a region in which the aforementioned compound (α) is not present.

Hereinafter, the specific examples are list for explanation. However, the preset invention is not limited to the following examples.

[Method of Synthesizing the Compound α (—OH Imparting Agent)]

SYNTHESIS EXAMPLE A-1

0.1 mol (18.4 g) of cyanuric chloride was added to 200 ml of an acetone solution at a temperature of 0 to 5° C. 100 ml of an aqueous solution containing 0.204 mol of NaN$_3$ was dripped into this cyanuric chloride solution while it was stirred. The stirring continued to be performed for 30 minutes also after the dripping was finished. Thereafter, an organic layer was extracted with ether from this mixture solution. And, filtering was performed. Thereafter, the ether was removed with a rotary evaporator. Next, a crude product was obtained with depressurized drying. The crude product was refined with a silica gel column chromatography (developing solvent:mixture solvent (chloroform:hexane=1:2)). The obtained refined product was oil-formed. The amount thereof was 18.1 g (a yield: 91.5%).

The obtained refined product (compound) was identified by an element analysis measurement device, an NMR measurement device and an MS measurement device. As a result, the refined product was determined to be 2,4-diazide-6-chloro-1,3,5-triazine (DAMC). The element analysis measurement device is Perkin Elmer model 2400CHN. The NMR measurement device is AC400P made by Bruker Japan Co. ltd. The MS measurement device is JEOL JMS-700. An element analysis measurement device, an NMR measurement device and an MS measurement device to be used hereinafter are identical to the aforementioned devices, respectively.

DAMC $^{13}$C NMR (101 MHz, CDCl$_3$) d 171.4, 172.6

EI-MS (70 eV) m/z 197 (M+)

Elemental analysis (actual value/calculated value) C: 18.3/18.24, N: 63.6/63.81.

9.88 g (0.050 mol) of the aforementioned DAMC was added to 100 ml of tetrahydrofuran (THF). And, it was placed under a nitrogen environment. 100 ml of a THF solution containing 0.050 mol (11.5 ml) of triethoxysilylpropyl amine and 0.051 mol (7.2 ml) of triethyl amine was dripped into this DAMC solution. And, the stirring was performed for 120 minutes at a temperature 50° C. The generated triethylamine hydrochloride was removed after the reaction was finished. THF was evaporated under depressurization (20 mmHg), and the crude product was obtained. The obtained crude product was refined by the silica gel column chromatography (developing solvent: chloroform). The obtained refined product was white powder. The amount thereof was 18.55 g (a yield: 97%).

The obtained refined product (compound) was identified by the element analysis measurement device, the NMR measurement device and the MS measurement device. As a result, the refined product was determined to be 6-(3-triethoxysilylpropyl)amino-1,3,5-triazine-2,4-diazide (TE-DAZ).

TE-DAZ $^1$H NMR (400 MHz, CDCl3) δ 0.67 (t, J=8.0 Hz, 2H (CH2CH2Si), 1.23 (t, J=7.0 Hz, 9H SiOCH2CH3), 1.73 (quint. 2H, CH2CH2CH2Si), 3.46 (q. J=8.0 Hz, 2H, NHCH2CH2CH2), 3.83 (q, J=7.0 Hz, 6H, SiOCH2CH3), 6.36 (br s, 1H, NHCH2CH2CH2)

$^{13}$C NMR (101 MHz, CDCl$_3$) δ 7.7, 18.2, 22.5, 43.4, 58.5, 166.8, 169.6, 170.3

EI-MS (70 eV) m/z 382 (M+)

Element analysis (actual value/calculated value) C: 37.4/37.69, H: 5.9/5.80, N: 36.9/36.62.

SYNTHESIS EXAMPLE A-2

The synthesis was performed in accordance with the aforementioned [synthesis example A-1].

That is, in the aforementioned [synthesis example A-1], the synthesis was performed similarly except that 0.050 mol (21.9 ml) of bis(3-triethoxysilylpropyl)amine was employed instead of 0.050 mol (11.5 ml) of triethoxysilylpropyl amine. The obtained refined product was oil-formed. The amount thereof was 28.17 g (a yield: 96%).

The obtained refined product (compound) was identified by the element analysis measurement device, the NMR measurement device and the MS measurement device. As a result, the refined product was determined to be 6-bis(3-triethoxysilylpropyl)amino-1,3,5-triazine-2,4-diazide (BTE-DAZ).

BTE-DAZ $^1$H NMR (400 MHz, CDCl3) δ 0.59 (t, J=8.0 Hz, 4H (CH2CH2Si), 1.22 (t, J=6.9 Hz, 18H SiOCH2CH3), 1.66-1.74 (m, 4H, CH2CH2CH2Si), 3.53 (t, J=8.0 Hz, 4H, NCH2CH2), 3.82 (q, J=6.9 Hz, 12H, SiOCH2CH3)

$^{13}$C NMR (101 MHz, CDCl3) δ 7.6, 18.3, 20.9, 50.2, 58.4, 165.3, 169.8

EI-MS (70 eV) m/z 586 (M+)

Element analysis (actual value/calculated value) C: 43.2/42.98, H: 7.3/7.21, N: 23.6/23.87.

SYNTHESIS EXAMPLE A-3

The synthesis was performed in accordance with the aforementioned [synthesis example A-1].

That is, in the aforementioned [synthesis example A-1], the synthesis was performed similarly except that 0.102 mol of NaN$_3$ was employed. The obtained refined product was oil-formed. The amount thereof was 17.2 g (a yield: 90%).

The obtained refined product (compound) was identified by the element analysis measurement device, the NMR measurement device and the MS measurement device. As a result, the refined product was determined to be 2-azide-4,6-dichloro-1,3,5-triazine (MADC).

MADC $^{13}$C NMR (101 MHz, CDCl3) d 171.5, 172.8

EI-MS (70 eV) m/z 190 (M+)

Element analysis (actual value/calculated value) C: 18.5/18.87, N: 44.3/44.01.

4.35 g (0.023 mol) of the aforementioned MADC was added to 50 ml of tetrahydrofuran (THF). And, it was placed under a nitrogen environment. 40 ml of the THF solution containing 0.048 mol (11 ml) of aminopropyl triethoxysilane was dripped into this MADC solution. Thereafter, 40 ml of the THF solution containing 0.048 mol (6.8 ml) of triethylamine was dripped. After the dripping was finished, the temperature rising treatment was performed until the temperature of the reaction solution was raised to 45° C. Thereafter, the stirring was performed for one hour. The reaction solution was cooled down to the room temperature. The ammonium salts were deposited, whereby separation filtering was executed by means of suction filtration. The filtrate was condensed by the rotary evaporator. The crude product was obtained by means of the depressurized drying. The crude product was refined by the silica gel column chromatography (developing solvent: mixture solvent (ethyl acetate:hexane=1:2)). The obtained refined product was colorless and oil-formed. The amount thereof was 10.86 g (a yield: 85%).

The obtained refined product (compound) was identified by the element analysis measurement device, the NMR measurement device and the MS measurement device. As a result, the refined product was determined to be 2-azide-4,6-bis(3-triethoxysilylpropyl)amino-1,3,5-triazine (TE-MAZ).

TE-MAZ $^1$H NMR (400 MHz, CDCl$_3$) d 0.66 (t, J=8.0 Hz, 4H, CH$_2$CH$_2$Si), 1.23 (t, J=7.0 Hz, 18H, SiOCH$_2$CH$_3$), 1.69 (br s, 4H, CH$_2$CH$_2$CH$_2$Si), 3.34-3.42 (m, 4H, NCH$_2$CH$_2$), 3.82 (q, J=7.0 Hz, 12H, SiOCH$_2$CH$_3$), 5.40, 5.54 and 5.64 (br s×3, 2H, NHCH$_2$)

FAB-MS m/z 561 (M$^+$+1);

Element analysis (actual value/calculated value) C: 45.1/44.98, H: 8.2/7.91, N: 20.1/19.98.

EXAMPLE 1

[Step (X)]

The substrate made of the ABS resin was prepared. This substrate was subjected to ultrasonic washing in ethanol of which the temperature was 40° C. for 10 minutes. After the ultrasonic washing, the above substrate was immersed (temperature: 20° C. and time: five minutes) in an ethanol solution (concentration: 2 mmol) of the compound TE-DAZ. After the substrate was lifted up, it was dried.

[Step (W)]

After the step (X), the aforementioned substrate was irradiated with the ultraviolent rays. At the moment of this ultraviolent ray irradiation, for example, the mask with a predetermined pattern was employed so as to comply with a wiring pattern. The ultraviolent ray irradiation device is a high-pressure mercury lamp (EYEMINIGRANTAGE made by EYE GRAPHICS CO. Ltd., output: 2 kw, irradiation energy: 30 mJ/cm$^2$). After the aforementioned ultraviolent ray irradiation, the aforementioned substrate was washed with ethanol.

[Step (Y)]

After the aforementioned step (W), the aforementioned substrate was immersed (temperature: 25° C. and time: one minute) in a catalyst treatment solution (NP-8; 150 ml/L made by C. Uemura & CO. Ltd. and HCL; 150 ml/L). With this, the surface was impregnated with the Pd—Sn catalyst. This substrate impregnated with the Pd—Sn catalyst was immersed (temperature: 33° C. and time: 20 minutes) in an electroless copper plating bath (SULCUP PSY-1A made by C. Uemura & CO.; 100 ml/L, SULCUP PSY-1B made by C. Uemura & CO.; 55 ml/L, and 18.5% formalin solution: 20 ml/L). With this, the Cu plating film having a thickness of 0.2 μm was formed on the surface.

EXAMPLE 2

The steps were taken in accordance with the aforementioned example 1. That is, in the aforementioned example 1, the steps were taken likewise except that BTE-DAZ was employed instead of TE-DAZ.

EXAMPLE 3

The steps were taken in accordance with the aforementioned example 1. That is, in the aforementioned example 1, the steps were taken likewise except that TE-MAZ was employed instead of TE-DAZ.

COMPARATIVE EXAMPLE 1

The steps were taken in accordance with the aforementioned example 1. That is, in the aforementioned example 1, the steps were taken likewise except that TE-ASH (azide sulfonate hexyl triethoxysilane) was employed instead of TE-DAZ.

[Properties]

The following measurement was performed for samples obtained in the aforementioned examples 1 to 3 and comparative example 1, so a result thereof is shown in Table-1.

Element composites in a surface layer (depth: 8 nm) were measured by an X-ray photoelectron spectroscopy (Perkin Elmer PHI 5600 ESCA made by ULVAC-PHI CO.)

Contact angles were measured by a contact angle measurement device (Elma-type G-1).

The adhesiveness of the Cu plating was investigated as follows. The aforementioned samples were notched (10 per mm longitudinally/laterally). That is, a total of 100 squares (□) were formed. Adhesive tapes (Scotch clear tape made by Sumitomo 3M Limited) were affixed, and thereafter, were peeled off. The number of pieces peeled at this time was counted.

TABLE 1

|  | Compound α | Element composition (at %) | | Contact angle (°) | Number of peeled tapes |
|---|---|---|---|---|---|
|  |  | N1s | Si2p |  |  |
| Example 1 | TE-DAZ | 19.1 | 3.6 | 36 (84) | 0 (100) |
| Example 2 | BTE-DAZ | 19.0 | 7.2 | 25 (82) | 0 (100) |
| Example 3 | TE-MAZ | 9.8 | 5.1 | 34 (83) | 0 (100) |
| Comparative example 1 | TE-ASH | 4.0 | 0.0 | 81 (83) | 100 (100) |

Of the numerical values in the contact angle and the number of peeled tapes, the numerical values outside ( ) are the contact angle and the number of peeled tapes in the locations irradiated with the ultraviolet rays, and the numerical values inside ( ) are the contact angle and the number of peeled tapes in the locations not irradiated with the ultraviolet rays.

It can be seen from Table-1 that by irradiating the substrate to which the compound a has stuck with the ultraviolent rays, the addition reaction occurs between the nitrene generated from the azide group of the compound α, and the C—H group or the C=C group of the resin substrate, and thus, the compound a has been bonded to the surface of the resin substrate. That is, it can be seen that the alkoxysilyl groups exist on the surface of the resin substrate. The ABS resin originally has 4 atom percents of N based on the acrylonitrile. However, any of these examples has a value higher than this numerical value. That is, it can be seen that the triazine ring has been bonded to the surface of the ABS resin.

The contact angle of the resin substrate of which the surface has the compound α bonded hereto is small. However, the contact angle of the locations not irradiated with the ultraviolet rays is large. It can be seen from this that the compound a has been removed by the ethanol washing in the locations not irradiated with the ultraviolet rays.

With the electroless plating, the Cu film is formed on the substrate surface. The adhesive strength of this Cu plating film is high in the locations in which the compound a has been bonded to the resin substrate with the ultraviolet ray irradiation.

It can be seen from this that the technology of these examples is preferredly employed for design (decorative) products for automobiles, construction materials and daily necessaries, and for the circuit substrates by the semi-additive technique. Needless to say, it is understood that the technology of these examples can be used for products other than these.

EXAMPLES 4 to 6

At first, the steps were taken in accordance with the aforementioned examples 1 to 3. However, the immersing time in the electroless copper plating bath is ten minutes. Thus, the thickness of the formed electroless copper plating film was 0.1 μm.

Thereafter, the electroplating was performed. The electrolytic bath employed for this electroplating was SULCUP ETN bath (CuSO$_4$.5H$_2$O; 80 g/L, H$_2$SO$_4$; 200 g/L, and Cl$^-$; 50 ppm), SULCUP ETN-1A bath (1 ml/L), and SULCUP ETN-1B bath (10 ml/L) made by C. Uemura & CO. The current was 2.5 A/dm$^2$. The time was 120 minutes. The temperature was 25° C. The thickness of the Cu plating film obtained in such a manner was 30 μm.

COMPARATIVE EXAMPLE 2

At first, the steps were taken in accordance with the aforementioned comparative example 1. However, the immersing time in the electroless copper plating bath is ten minutes.

Thereafter, the electroplating was performed. The electrolytic bath employed for this electroplating was SULCUP ETN bath (CuSO$_4$.5H$_2$O; 80 g/L, H$_2$SO$_4$; 200 g/L, and Cl$^-$; 50 ppm), SULCUP ETN-1A bath (1 ml/L), and SULCUP ETN-1B bath (10 ml/L) made by C. Uemura & CO. The current was 2.5 A/dm$^2$. The time was 120 minutes. The temperature was 25° C.

[Properties]

The following measurement was performed for samples obtained in the aforementioned examples 4 to 6 and comparative example 2, so a result thereof is shown in Table-2.

The device employed for the measurement of the aforementioned example 1 was employed for the measurement of XPS analysis.

A peeling test machine (Autograph P-100 made by Shimadzu Corporation) was employed for measuring the adhesive strength of the Cu plating film. The condition that the peeling speed at the time of the measurement was 50 mm/min was adopted.

TABLE 2

| | Compound α | XPS analysis value (Si2p: at %) | Adhesive strength (kN/m) |
|---|---|---|---|
| Example 4 | TE-DAZ | 3.1 | 2.6 |
| Example 5 | BTE-DAZ | 5.8 | 2.4 |
| Example 6 | TE-MAZ | 4.6 | 2.3 |
| Comparative example 2 | TE-ASH | <0.1 | <0.1 |

It is understood that the adhesive strength of the Cu plating film of these examples is very large. Thus, the technology of these examples is preferredly employed for design (decorative) products for automobiles, construction materials and daily necessaries, and for the circuit substrates by the semi-additive technique. Needless to say, it is understood that the technology of these examples can be used for products other than these.

EXAMPLES 7 to 22

The steps were taken in accordance with the example 4. However, in these examples, substrates made of EP (epoxy) resin, substrates made of PET (polyester) resin, substrates made of PA6 (6-nylon) resin, substrates made of PI (poly imide) resin, substrates made of ABS resin, substrates made of PC (poly carbonate) resin, substrates made of PSt (poly styrene) resin, substrates made of PE (poly ethylene) resin, substrates made of PP (poly propylene) resin, substrates made of COP (cyclo olefin polymer) resin, substrates made of PPS (poly phenylene sulfide) resin, substrates made of PEEK (polyether ketone) resin, NBR (nitrile butadiene rubber) substrates, FKM (fluoro rubber) substrates, Q (silicone rubber) substrates, and SBR (styrene butadiene rubber) substrates were employed.

COMPARATIVE EXAMPLES 3 to 18

The steps were taken in accordance with the comparative example 2. However, in this comparative example, substrates made of EP resin, substrates made of PET resin, substrates made of PA6 resin, substrates made of PI resin, substrates made of ABS resin, substrates made of PC resin, substrates made of PSt resin, substrates made of PE resin, substrates made of PP resin, substrates made of COP resin, substrates made of PPS resin, substrates made of PEEK resin, NBR substrates, FKM substrates, Q substrates, and SBR substrates were employed.

[Properties]

The adhesive strength of the obtained Cu plating film having a thickness of 30 μm was investigated, so a result thereof is shown in Table 3. A heat shock test was also performed, so a result thereof is shown in Table 3.

Adhesive strength: it was measured in accordance with JIS K6854. That is, at first, the Cu plating film was notched at a width of one cm. And, it was peeled by the position of 2 cm from the end and subjected to a T-character type peeling test at a speed of 50 mm/minute with Autograph P-100 made by Shimadzu Corporation.

Heat shock test; Thermal Shock Chamber (TSA-71H-W made by ESPEC CORP.) was employed. And, after the substrates were placed in the following environment (three cycles of 85° C. (60 minutes)→normal temperature (60 minutes)→−40° C. (30 minutes)→normal temperature (30 minutes)→85° C. (60 minutes)), the substrate surface was observed with the naked eye.

TABLE 3

| | Substrate | Adhesive strength of Cu plating film | Heat shock test |
|---|---|---|---|
| Example 7 | EP | 1.6 (kN/m) | Without bulking |
| Comparative example 3 | EP | <0.1 (kN/m) | With bulking |
| Example 8 | PET | 1.1 (kN/m) | Without bulking |
| Comparative example 4 | PET | <0.1 (kN/m) | With bulking |
| Example 9 | PA6 | 2.5 (kN/m) | Without bulking |
| Comparative example 5 | PA6 | <0.1 (kN/m) | With bulking |
| Example 10 | PI | 0.9 (kN/m) | Without bulking |
| Comparative example 6 | PI | <0.1 (kN/m) | With bulking |
| Example 11 | ABS | 2.7 (kN/m) | Without bulking |
| Comparative example 7 | ABS | <0.1 (kN/m) | With bulking |
| Example 12 | PC | 1.2 (kN/m) | Without bulking |
| Comparative example 8 | PC | <0.1 (kN/m) | With bulking |
| Example 13 | PSt | 1.1 (kN/m) | Without bulking |
| Comparative example 9 | PSt | <0.1 (kN/m) | With bulking |
| Example 14 | PE | 1.4 (kN/m) | Without bulking |
| Comparative example 10 | PE | <0.1 (kN/m) | With bulking |
| Example 15 | PP | 1.2 (kN/m) | Without bulking |

TABLE 3-continued

| | Substrate | Adhesive strength of Cu plating film | Heat shock test |
|---|---|---|---|
| Comparative example 11 | PP | <0.1 (kN/m) | With bulking |
| Example 16 | COP | 1.5 (kN/m) | Without bulking |
| Comparative example 12 | COP | <0.1 (kN/m) | With bulking |
| Example 17 | PPS | 0.6 (kN/m) | Without bulking |
| Comparative example 13 | PPS | <0.1 (kN/m) | With bulking |
| Example 18 | PEEK | 0.6 (kN/m) | Without bulking |
| Comparative example 14 | PEEK | <0.1 (kN/m) | With bulking |
| Example 19 | NBR | 1.8 (kN/m) | Without bulking |
| Comparative example 15 | NBR | <0.1 (kN/m) | With bulking |
| Example 20 | FKM | 3.7 (kN/m) | Without bulking |
| Comparative example 16 | FKM | <0.1 (kN/m) | With bulking |
| Example 21 | Q | 2.8 (kN/m) | Without bulking |
| Comparative example 17 | Q | <0.1 (kN/m) | With bulking |
| Example 22 | SBR | 1.9 (kN/m) | Without bulking |
| Comparative example 18 | SBR | <0.1 (kN/m) | With bulking |

It can be seen from this that the Cu plating films of these examples are excellent in the adhesive strength.

EXAMPLES 23 to 28

At first, the substrate made of PE resin was immersed in a TE-DAZ ethanol solution (first treatment). Thereafter, the ultraviolent ray irradiation was performed. Next, the aforementioned substrate was immersed in a polydiethoxysilane (PDES) solution and/or a 6-triethoxysilylpropyl amino-1,3,5-triazine-2,4-dithiol monosodium (TES) solution (second treatment). And, the ethanol washing was performed. With this, the substrate to be subjected to the electronless plating was obtained. That is, the substrate going through the aforementioned treatment was employed, and the electronless plating film and the electroplating film were formed in accordance with the example 1.

The adhesive strength of the Cu plating film having a thickness of 30 μm obtained in such a manner was investigated in accordance with JIS K 6854, so a result thereof is shown in Table 4.

TABLE 4

| | Substrate | First treatment/second treatment | Adhesive strength (kN/m) |
|---|---|---|---|
| Example 23 | PE | 0.01 wt % TE-DAZ/ 0.5 wt % PDES (80° C. × 10 min) | 0.5 |
| Example 24 | PE | 0.01 wt % TE-DAZ/ 0.1 wt % TES (120° C. × 10 min) | 0.7 |
| Example 25 | PE | 0.01 wt % TE-DAZ/ 0.5 wt % PDES (80° C. × 10 min) + 0.1 wt % TES (120° C. × 10 min) | 1.1 |
| Reference example | PE | 0.01 wt % TE-DAZ/nothing | 0.3 |
| Reference example | PE | 0.1 wt % TE-DAZ/nothing | 1.4 |
| Example 26 | PP | 0.01 wt % TE-DAZ/ 0.5 wt % PDES (80° C. × 10 min) | 0.4 |
| Example 27 | PP | 0.01 wt % TE-DAZ/ 0.1 wt % TES (120° C. × 10 min) | 0.7 |
| Example 28 | PP | 0.01 wt % TE-DAZ/ 0.5 wt % PDES (80° C. × 10 min) + 0.1 wt % TES (80° C. × 10 min) | 1.0 |
| Reference example | PP | 0.01 wt % TE-DAZ/nothing | 0.3 |
| Reference example | PP | 0.1 wt % TE-DAZ/nothing | 1.2 |

It can be seen from these examples that the treatment as well by the compounds as well represented by the aforementioned general formulas [II], [III] and [IV] after the treatment by the compound (α) contributes to enhancing the adhesive strength of the metal plating film all the more.

[Method of Synthesizing the Compound α (—OH Imparting Agent)]

SYNTHESIS EXAMPLE A-4

0.1 mol (18.4 g) of cyanuric chloride was added to 200 ml of a THF solution at a temperature of −10° C. And, it was placed under a nitrogen environment. 100 ml of the THF solution containing 0.105 mol (35.0 g) of 11-aminoundecyl triethoxysilane and 0.105 mol (14.6 ml) of triethylamine was dripped in to this cyanuric chloride solution. The stirring continued to be performed for 30 minutes also after the dripping was finished. After the reaction was finished, the generated triethylamine hydrochloride was removed. THF was evaporated under depressurization (20 mm Hg) and the crude product was obtained. The obtained crude product was refined by the silica gel column chromatography. The obtained refined product was oil-formed. The amount thereof was 43.05 g (a yield: 89.4%).

The obtained refined product (compound) was identified by the element analysis measurement device, the NMR measurement device and the MS measurement device. As a result, the refined product was determined to be 6-(11-trietoxysilylundecylpropyl)amino-1,3,5 triazine-2,4-dichloride (TEU-DC).

TEU-DC $^1$H NMR (400 MHz, CDCl3) d 0.63 (t, J=8.0 Hz, 2H (CH2CH2Si), 1.23 (t, J=7.0 Hz, 9H, SiOCH2CH3), 1.24-1.42 (m, J=8.0 Hz, 16H, NHCH2CH(CH2)8CH2), 1.58 (quint, J=8.0 Hz, 2H (NHCHCH2CH2), 3.46 (q. J=8.0 Hz, 2H, NHCH2CH2), 3.81 (q, J=7.0 Hz, 6H, SiOCH2CH3), 5.82 (brs, 1H, NH)

$^{13}$C NMR (101 MHz, CDCl3) d. 10.11, 18.27, 22.60, 26.40, 29.16, 29.28, 29.52, 29.57, 33.12, 41.34, 58.25, 166.88, 169.55, 170.47

EI-MS (70 eV) m/z 480 (M$^+$)

Element analysis (actual value/calculated value): C: 49.7/49.89, H: 7.9/7.95, N: 11.7/11.64.

24.1 g (0.050 mol) of the aforementioned TEU-DC was added to 200 ml of ethanol at a temperature of 50 to 60° C. And, it was placed under a nitrogen environment. 50 ml of ethanol containing 0.102 mol of NaN$_3$ was dripped into this TEU-DC solution while it was stirred. The stirring continued to be performed for seven hours also after the dripping was finished. The deposited salts were filtered. Thereafter, ethanol was removed with the rotary evaporator. Next, isopropyl alcohol (IPA) and water were employed for re-precipitation. The deposited crystal was filtered. Thereafter, the drying was performed. The obtained refined product was oil-formed. The amount thereof was 23.5 g (a yield: 95.2%).

The obtained refined product (compound) was identified by the element analysis measurement device, the NMR measurement device and the MS measurement device. As a result, the refined product was determined to be 6-(11-trietoxysilylundecyl)amino-1,3,5-triazine-2,4-diazide (TEU-DAZ).

TEU-DAZ $^1$H NMR (400 MHz, CDCl3) d 0.63 (t, J=8.0 Hz, 2H, CH2CH2Si), 1.23 (t, J=7.0 Hz, 9H, SiOCH2CH3), 1.24-1.42 (m, J=8.0 Hz, 16H, NHCH2CH2(CH2)8CH2), 1.58 (quint, J=8.0 Hz, 2H, NHCH2CH2CH2), 3.46 (q, J=8.0 Hz, 2H, NHCH2CH2), 3.81 (q, J=7.0 Hz, 6H, SiOCH2CH3), 5.98 (br s, 1H, NH)

$^{13}$C NMR (101 MHz, CDCl3) d. 10.38, 18.29, 22.74, 26.37, 29.22, 29.26, 29.49, 29.55, 33.17, 41.15, 58.27, 166.91, 169.63, 170.43

EI-MS (70 eV) m/z 494 (M$^+$)

Element analysis (actual value/calculated value) C: 48.4/48.56, H: 7.8/7.74, N: 28.1/28.32.

SYNTHESIS EXAMPLE A-5

5.0 g (0.027 mol) of cyanuric chloride was added to 50 ml of a THF solution at a temperature of −10° C. And, it was placed under a nitrogen environment. 30 ml of the THF solution containing 5.2 g (0.027 mol) of 3-aminopropyl diethoxymethylsilane and 3.8 g (0.038 mol) of triethylamine was dripped into this cyanuric chloride solution. The stirring continued to be performed for two hours also after the dripping was finished. After the reaction was finished, the generated triethylamine hydrochloride was removed. THF was evaporated under depressurization (20 mm Hg), and the product was obtained. The obtained product was oil-formed. The amount thereof was 9.19 g (a yield: 100.0%). The obtained product (compound) was identified by the element analysis measurement device, the NMR measurement device and the MS measurement device. As a result, the refined product was determined to be 6-(3-dietoxymethylsilylpropyl)amino-1,3,5-triazine-2,4-dichloride (DEM-DC).

DEM-DC $^1$H NMR (400 MHz, CDCl3) d 0.14 (s, J=8.0 Hz, 3H, CH2CH2SiCH3), 0.65 (t, J=8.0 Hz, 2H, CH2CH2Si), 1.23 (t, J=7.0 Hz, 6H, SiOCH2CH3), 1.71 (quint, J=8.0 Hz, 2H, NHCHCH2CH2), 3.50 (q, J=8.0 Hz, 2H, NHCH2CH2), 3.77 (q, J=7.0 Hz, 4H, SiOCH2CH3), 6.72 (br s, 1H, NH)

$^{13}$C NMR (101 MHz, CDCl3) d. −4.99, 11.18, 18.33, 22.35, 43.85, 58.32, 165.79, 169.65, 170.85

EI-MS (70 eV) m/z 450 (M$^+$)

Element analysis (actual value/calculated value) C: 38.8/38.94, H: 6.0/5.94, N: 16.5/16.51.

9.19 g (0.027 mol) of the aforementioned DEM-DC was added to 100 ml of methanol at a temperature of 50 to 60° C. And, it was placed under a nitrogen environment. 50 ml of methanol containing 3.8 g (0.059 mol) of NaN$_3$ was dripped into this DEM-DC solution while it was stirred. The stirring continued to be performed for three hours also after the dripping was finished. Methanol was evaporated under depressurization (20 mm Hg) and the crude product was obtained. 200 ml of ether was added to this crude product. The generated salts and an excess amount of NaN$_3$ were removed. It was refined by the silica gel column chromatography. The obtained refined product was white powder. The amount thereof was 9.2 g (a yield: 93%).

The obtained refined product (compound) was identified by the element analysis measurement device, the NMR measurement device and the MS measurement device. As a result, the refined product was determined to be 6-(3-dietoxymethylsilylpropyl)amino-1,3,5-triazine-2,4-diazide (DEM-DAZ).

DEM-DAZ $^1$H NMR (400 MHz, CDCl3) d 0.13 (s, J=8.0 Hz, 3H, CH2CH2SiCH3), 0.65 (t, J=8.0 Hz, 2H, CH2CH2Si), 1.22 (t, J=7.0 Hz, 6H, SiOCH2CH3), 1.69 (quint, J=8.0 Hz, 2H, NHCHCH2CH2), 3.45 (q, J=8.0 Hz, 2H, NHCH2CH2), 3.77 (q, J=7.0 Hz, 4H, SiOCH2CH3), 6.29 (br s, 1H, NH)

$^{13}$C NMR (101 MHz, CDCl3) d. −4.99, 11.24, 18.36, 22.65, 43.61, 58.26, 166.89, 169.66, 170.85

EI-MS (70 eV) m/z 352 (M$^+$)

Element analysis (actual value/calculated value) C: 37.3/37.49, H: 5.6/5.72, N: 39.8/39.74.

SYNTHESIS EXAMPLE A-6

10.0 g (0.054 mol) of cyanuric chloride was added to 100 ml of a THF solution at a temperature of −10° C. And, it was placed under a nitrogen environment. 60 ml of the THF solution containing 12.8 g (0.054 mol) of 4-aminobutyltriethoxysilane and 7.7 g (0.075 mol) of triethylamine was dripped into this cyanuric chloride solution. The stirring continued to be performed for two hours also after the dripping was finished. After the reaction was finished, the generated triethylamine hydrochloride was removed. THF was evaporated under depressurization (20 mm Hg), and the crude product was obtained. The obtained crude product was refined by the silica gel column chromatography. The obtained refined product was oil-formed. The amount thereof was 17.1 g (a yield: 83.0%).

The obtained product (compound) was identified by the element analysis measurement device, the NMR measurement device and the MS measurement device. As a result, the refined product was determined to be 6-(4-trietoxysilylbutyl)amino-1,3,5-triazine-2,4-dichloride (TEB-DC).

TEB-DC $^1$H NMR (400 MHz, CDCl3) d 0.65 (t, J=8.0 Hz, 2H, CH2CH2Si), 1.22 (t, J=7.0 Hz, 9H, SiOCH2CH3), 1.50 (quint, J=8.0 Hz, 2H, CH2CH2Si), 1.71 (quint, J=8.0 Hz, 2H, NHCH2CH2CH2), 3.50 (q, J=8.0 Hz, 2H, NHCH2CH2), 3.82 (q, J=7.0 Hz, 6H, SiOCH2CH3), 6.70 (br s, 1H, NH)

$^{13}$C NMR (101 MHz, CDCl3) d. 9.98, 18.25, 20.06, 31.92, 41.16, 58.34, 165.76, 169.56, 170.90

EI-MS (70 eV) m/z 383 (M$^+$)

Element analysis (actual value/calculated value) C: 40.6/40.73, H: 6.3/6.31, N: 14.6/16.62.

15.0 g (0.039 mol) of the aforementioned TEB-DC was added to 100 ml of methanol at a temperature of 50 to 60° C. And, it was placed under a nitrogen environment. 50 ml of methanol containing 5.6 g (0.086 mol) of NaN$_3$ was dripped in this TEB-DC solution while it was stirred. The stirring continued to be performed for three hours also after the dripping was finished. Methanol was evaporated under depressurization (20 mm Hg) and the crude product was obtained. 200 ml of ether was added to this crude product. The generated salts and an excess amount of NaN$_3$ were removed. It was refined by the silica gel column chromatography. The obtained refined product was white powder. The amount thereof was 14.0 g (a yield: 97.2%).

The obtained refined product (compound) was identified by the element analysis measurement device, the NMR measurement device and the MS measurement device. As a result, the refined product was determined to be 6-(4-trietoxysilylbutyl)amino-1,3,5-triazine-2,4-diazide (TEB-DAZ).

TEB-DAZ $^1$H NMR (400 MHz, CDCl3) d 0.66 (t, J=8.0 Hz, 2H, CH2CH2Si), 1.22 (t, J=7.0 Hz, 9H, SiOCH2CH3), 1.50

(quint, J=8.0 Hz, 2H, CH2CH2Si), 1.65 (quint, J=8.0 Hz, 2H, NHCH2CH2CH2), 3.45 (q, J=8.0 Hz, 2H, NHCH2CH2), 3.81 (q, J=7.0 Hz, 6H, SiOCH2CH3), 6.06 (br s, 1H, NH)

$^{13}$C NMR (101 MHz, CDCl3) d. 10.03, 18.27, 20.10, 31.23, 40.74, 58.39, 165.90, 169.63, 170.43

EI-MS (70 eV) m/z 396 (M$^+$)

Element analysis (actual value/calculated value) C: 39.4/39.38, H: 6.0/6.10, N: 35.2/35.33.

EXAMPLES 29 TO 40 AND COMPARATIVE EXAMPLES 19 TO 22

The steps were taken in accordance with the aforementioned example 4. However, TEU-DAZ, DEM-DAZ, TEB-DAZ, and TE-ASH were employed instead of TE-DAZ. The employed sbstractes are substrates made of ABS resin, substrates made of PP resin, FKM substrates, and Q substrates.

[Properties]

An XPS analysis (X-ray Photoelectron Spectroscopy: the aforementioned device made of ULVAC-PHI) was performed before the aforementioned step Y (plating step) and after the aforementioned step W (ultraviolent ray irradiation step), so a result thereof is shown in Table 5.

TABLE 5

| Substrate | Compound (α) | XPS analysis | |
|---|---|---|---|
| | | H1s (at %) | Si2p (at %) |
| PP | TEU-DAZ | 10.2 | 2.1 |
| PP | DEM-DAZ | 16.1 | 3.3 |
| PP | TEB-DAZ | 13.9 | 2.8 |
| PP | TE-DAZ | 13.5 | 2.9 |
| PP | TE-ASH | <0.1 | <0.1 |

The adhesive strength of the obtained Cu plating film having a thickness of 30 μm was investigated, so a result thereof is shown in Table 6. The heat shock test was also performed, so a result thereof is shown in Table 6. The contents of the adhesive strength and the heat shock test are identical to those of the aforementioned adhesive strength and heat shock test.

TABLE 6

| | Substrate | Compound (α) | Adhesive strength of Cu plating film | Heat shock test |
|---|---|---|---|---|
| Example 29 | ABS | TEU-DAZ | 2.4 (kN/m) | Without bulking |
| Example 30 | ABS | DEM-DAZ | 2.5 (kN/m) | Without bulking |
| Example 31 | ABS | TEB-DAZ | 2.2 (kN/m) | Without bulking |
| Comparative example 19 | ABS | TE-ASH | <0.1 (kN/m) | With bulking |
| Example 32 | PP | TEU-DAZ | 2.0 (kN/m) | Without bulking |
| Example 33 | PP | DEM-DAZ | 2.4 (kN/m) | Without bulking |
| Example 34 | PP | TEB-DAZ | 2.1 (kN/m) | Without bulking |
| Comparative example 20 | PP | TE-ASH | <0.1 (kN/m) | With bulking |
| Example 35 | FKM | TEU-DAZ | 2.6 (kN/m) | Without bulking |
| Example 36 | FKM | DEM-DAZ | 2.9 (kN/m) | Without bulking |
| Example 37 | FKM | TEB-DAZ | 2.7 (kN/m) | Without bulking |
| Comparative example 21 | FKM | TE-ASH | <0.1 (kN/m) | With bulking |
| Example 38 | Q | TEU-DAZ | 2.6 (kN/m) | Without bulking |
| Example 39 | Q | DEM-DAZ | 2.3 (kN/m) | Without bulking |
| Example 40 | Q | TEB-DAZ | 2.1 (kN/m) | Without bulking |
| Comparative example 22 | Q | TE-ASH | <0.1 (kN/m) | With bulking |

It is can be seen from this that the Cu plating films of these examples are excellent in the adhesive strength.

This application is based upon and claims the benefit of priority from Japanese patent application No. 2010-225165, filed on Oct. 4, 2010, the disclosure of which is incorporated herein in its entirety by reference.

The invention claimed is:

1. A product equipped with a metal film, the product comprising:
a base,
a compound (α) applied onto a surface of the base; and
a wet-type plating metal film formed on the compound (α),
wherein the compound (α) is a compound represented by the formula [I]:

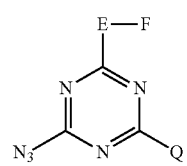

Formula [I]

wherein
E is N,
F is the OH group or the OH yielding group,
-Q is —N$_3$ or —NR$_1$(R$_2$),
R$_1$ and R$_2$ of —NR$_1$(R$_2$) are each independently H, a hydrocarbon group having a carbon number of 1 to 24, or —RSi(R')$_n$(OA)$_{3-n}$,
R is a chain hydrocarbon group having a carbon number of 1 to 12,
R' is a chain hydrocarbon group having a carbon number of 1 to 4,
A is H or a chain hydrocarbon group having a carbon number of 1 to 4, and
n is an integer of from 0 to 2; and
wherein the base comprises a polymer.

2. The product according to claim 1, wherein the base and the compound (α) are chemically bonded to each other.

3. The product according to claim 1, wherein the OH group or the OH yielding group is an alkoxysilyl group.

4. The product according to claim 1, wherein the compound (α) is a compound represented by the formula [Io]:

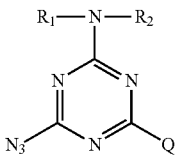

General formula [Io]

wherein
-Q is —N$_3$ or —NR$_1$(R$_2$),
R$_1$ and R$_2$ are each independently H, a hydrocarbon group having a carbon number of 1 to 24, or —RSi(R')$_n$(OA)$_{3-n}$,
R is a chain hydrocarbon group having a carbon number of 1 to 12,
R' is a chain hydrocarbon group having a carbon number of 1 to 4,
A is H or a chain hydrocarbon group having a carbon number of 1 to 4,
n is an integer of from 0 to 2, and
at least one, out of R$_1$ and R$_2$, is —RSi(R')$_n$(OA)$_{3-n}$.

5. The product according to claim 1, wherein the compound (α) is a compound represented by the formula [Ia]:

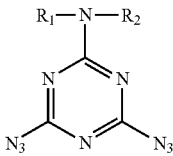

General formula [Ia]

wherein
R$_1$ and R$_2$ are each independently H, a hydrocarbon group having a carbon number of 1 to 24, or —RSi(R')$_n$(OA)$_{3-n}$,
R is a chain hydrocarbon group having a carbon number of 1 to 12,
R' is a chain hydrocarbon group having a carbon number of 1 to 4,
A is H or a chain hydrocarbon group having a carbon number of 1 to 4,
n is an integer of from 0 to 2, and
at least one, out of R$_1$ and R$_2$, is —RSi(R')$_n$(OA)$_{3-n}$.

6. The product according to claim 1, wherein the compound (α) is a compound represented by the formula [Ib]:

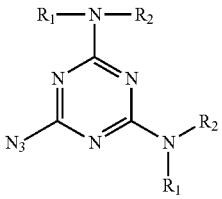

General formula [Ib]

wherein
R$_1$ and R$_2$ are each independently H, a hydrocarbon group having a carbon number of 1 to 24, or —RSi(R')$_n$(OA)$_{3-n}$,
R is a chain hydrocarbon group having a carbon number of 1 to 12,
R' is a chain hydrocarbon group having a carbon number of 1 to 4,
A is H or a chain hydrocarbon group having a carbon number of 1 to 4,
n is an integer of from 0 to 2, and
at least one, out of all R$_1$s and all R$_2$s, is —RSi(R')$_n$(OA)$_{3-n}$.

7. The product according to claim 1, wherein a substance represented by the formula [II]:

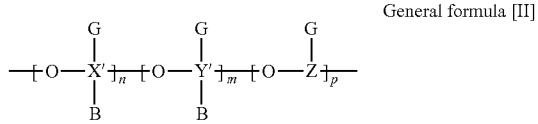

General formula [II]

is applied onto the surface of the compound (α),
wherein
X' and Y' are each independently Si or Ti,
Z is Al,
G is a hydrocarbon group having a carbon number of 1 to 3, or an alkoxy group having a carbon number of 1 to 3,
B is an alkoxy group having a carbon number of 1 to 3,
n and m are each independently an integer of from 0 to 200,
2≤n+m≤400, and
p is an integer of from 0 to 100.

8. The product according to claim 1, wherein a compound (β) comprising at least one group selected from the group consisting of an alkoxysilyl group, an alkoxy alminate group, and an alkoxy titanate group is applied onto the surface of the compound (α).

9. The product according to claim 8, wherein the compound (β) is a compound represented by the formula [T]:

L-Si(M')$_n$(OM)$_{3-n}$,  Formula [T]

wherein
L is an organic group,
M' is a chain hydrocarbon group having a carbon number of 1 to 4,
M is H or a chain hydrocarbon group having a carbon number of 1 to 4,
n is an integer of from 0 to 2, and
M' and M could be identical or could be different.

10. The product according to claim 8, wherein the compound (β) is a compound represented by the formula [III]:

Formula [III]

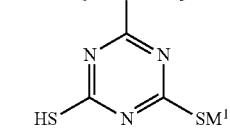

wherein
R$_5$ is a hydrocarbon group having a carbon number of 1 to 12,
R$_6$ is H or a hydrocarbon group having a carbon number of 1 to 10,
X" is H or a hydrocarbon group having a carbon number of 1 to 10,
Y" is an alkyloxy group having a carbon number of 1 to 10,
n is an integer of from 1 to 3, and
M$^1$ is H, Li, Na, K, or Cs.

11. The product according to claim 8, wherein the compound (β) is a compound represented by the formula [IV]:

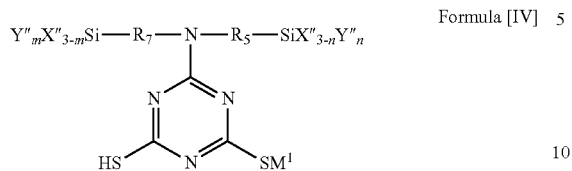

Formula [IV]

wherein
$R_5$ is a hydrocarbon group having a carbon number of 1 to 12,
$R_7$ is a hydrocarbon group having a carbon number of 1 to 12,
X" is H or a hydrocarbon group having a carbon number of 1 to 10,
Y" is an alkyloxy group having a carbon number of 1 to 10,
each of all X"s and all Y"s could be identical or could be different,
n and m are each independently an integer of from 1 to 3, and
$M^1$ is H, Li, Na, K or Cs.

12. The product according to claim 1, wherein the product is a wiring substrate.

* * * * *